US012588514B2

(12) United States Patent
Nishimura

(10) Patent No.: US 12,588,514 B2
(45) Date of Patent: Mar. 24, 2026

(54) ELECTRONIC PART AND SEMICONDUCTOR DEVICE

(71) Applicant: ROHM Co., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 896 days.

(21) Appl. No.: 17/679,539

(22) Filed: Feb. 24, 2022

(65) Prior Publication Data

US 2022/0270988 A1     Aug. 25, 2022

(30) Foreign Application Priority Data

Feb. 25, 2021     (JP) ................................. 2021-028308

(51) Int. Cl.
| | |
|---|---|
| *H01F 27/28* | (2006.01) |
| *H01F 27/29* | (2006.01) |
| *H01F 27/30* | (2006.01) |
| *H01L 23/64* | (2006.01) |
| *H10D 1/20* | (2025.01) |

(52) U.S. Cl.
CPC ............. *H01L 23/645* (2013.01); *H10D 1/20* (2025.01)

(58) Field of Classification Search
CPC .................. H01L 23/645; H01L 28/10; H01L 25/16–165; H01L 23/49562; H01L 23/49575; H01L 23/49596; H01F 27/29; H01F 27/2804; Y02E 60/60; Y02B 70/10; Y02T 10/62; Y02T 10/70; Y02T 10/7072; Y02T 10/72
See application file for complete search history.

(56) References Cited

U.S. PATENT DOCUMENTS

| | | | |
|---|---|---|---|
| 2010/0232658 A1 | 9/2010 | Omoto et al. | |
| 2019/0057942 A1* | 2/2019 | Male | H01F 27/24 |
| 2020/0118730 A1* | 4/2020 | Ryu | H01F 17/04 |

FOREIGN PATENT DOCUMENTS

| | | | |
|---|---|---|---|
| JP | 2012-182740 | | 9/2012 |
| JP | 2012182740 A | * | 9/2012 |
| JP | 2013051547 | | 3/2013 |

OTHER PUBLICATIONS

Notice of Reason for Refusal cited in JP2021-028308, mailed Oct. 8, 2024.

* cited by examiner

*Primary Examiner* — Monica D Harrison
*Assistant Examiner* — Moataz Khalifa
(74) *Attorney, Agent, or Firm* — CHIP Law Group

(57) ABSTRACT

Provided is an electronic part that includes a first substrate including a first base and a first coil, the first coil being electrically insulated from the first base, a second substrate including a second base and a second coil, the second coil being electrically insulated from the second base, and a support member that supports the first substrate and the second substrate. The first substrate is arranged between the second substrate and the support member in a thickness direction of the support member and overlaps the second substrate as viewed in the thickness direction, the first base is positioned between the first coil and the second coil in the thickness direction, and the first coil and the second coil are magnetically coupled.

10 Claims, 18 Drawing Sheets

F I G . 1
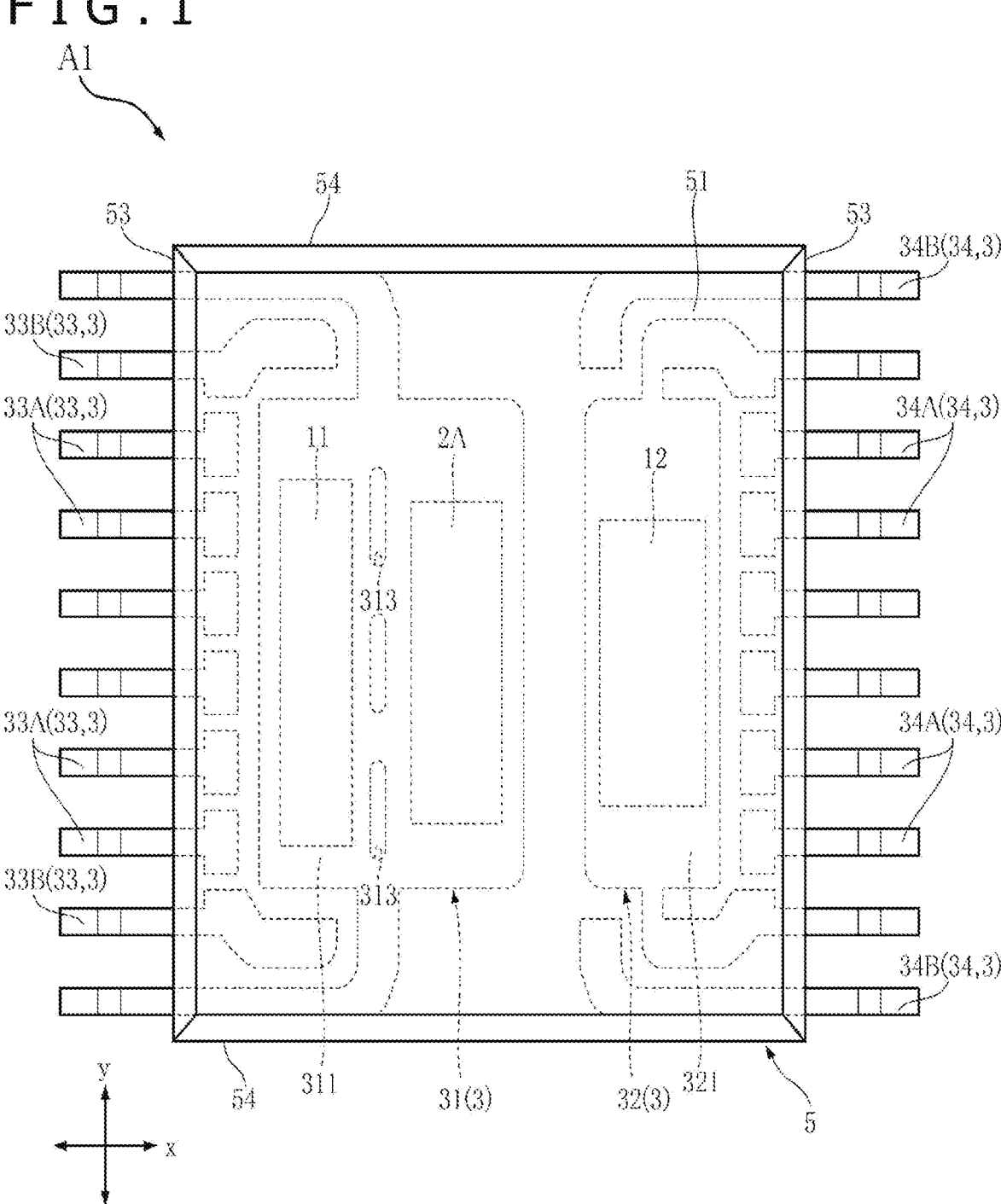

F I G . 7
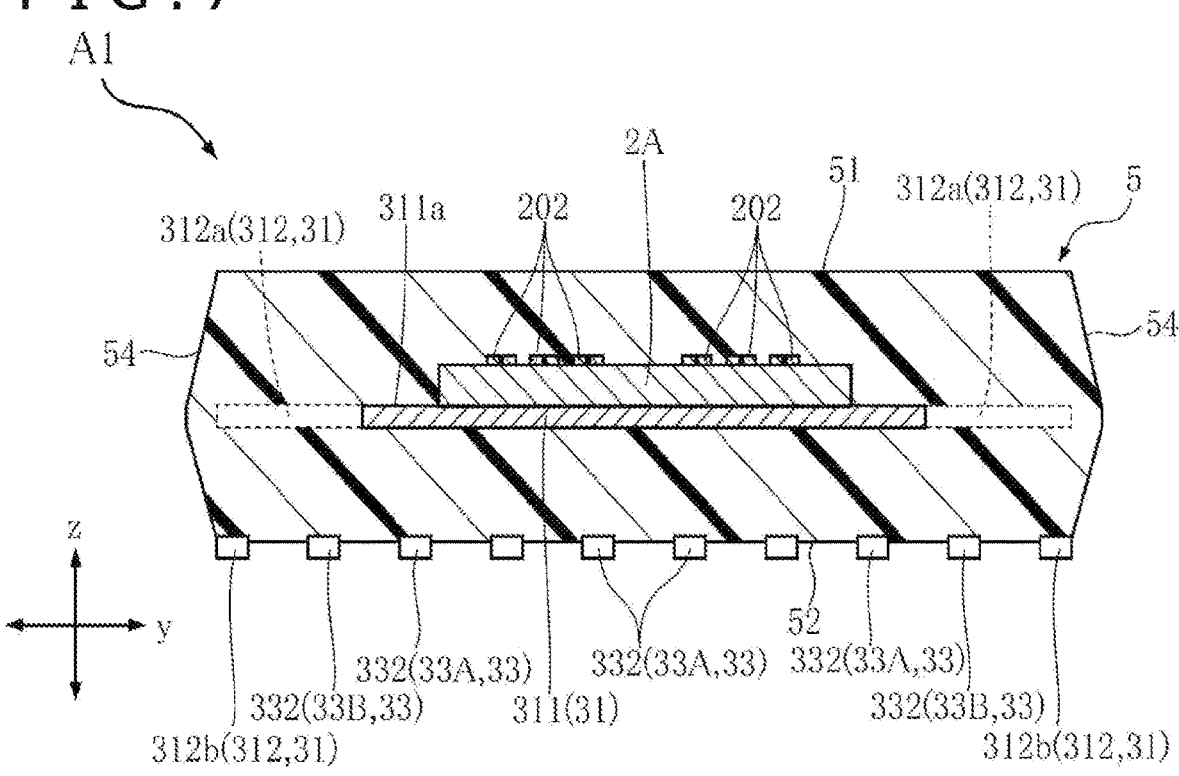

F I G . 9
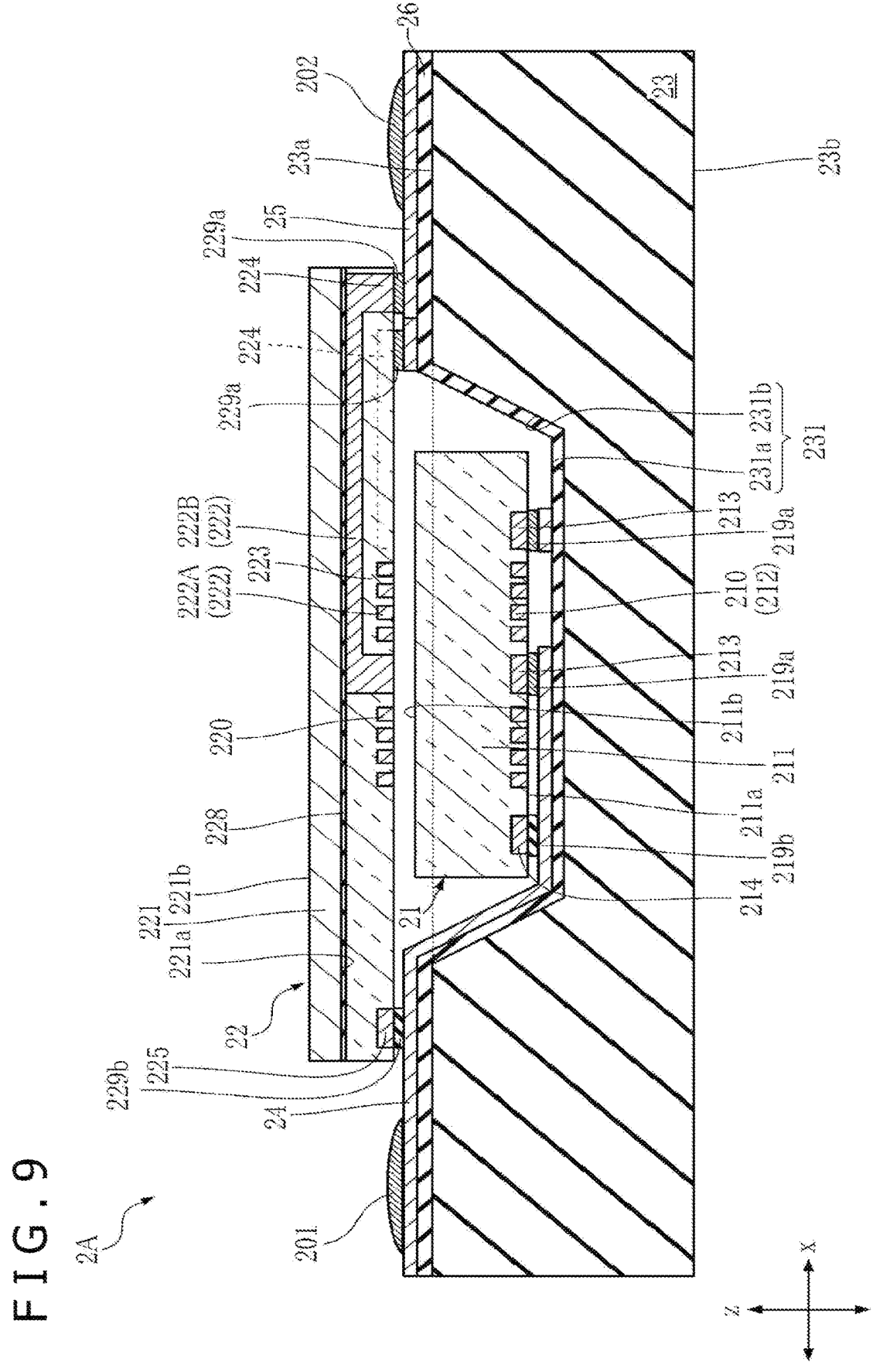

A2

F I G . 1 1
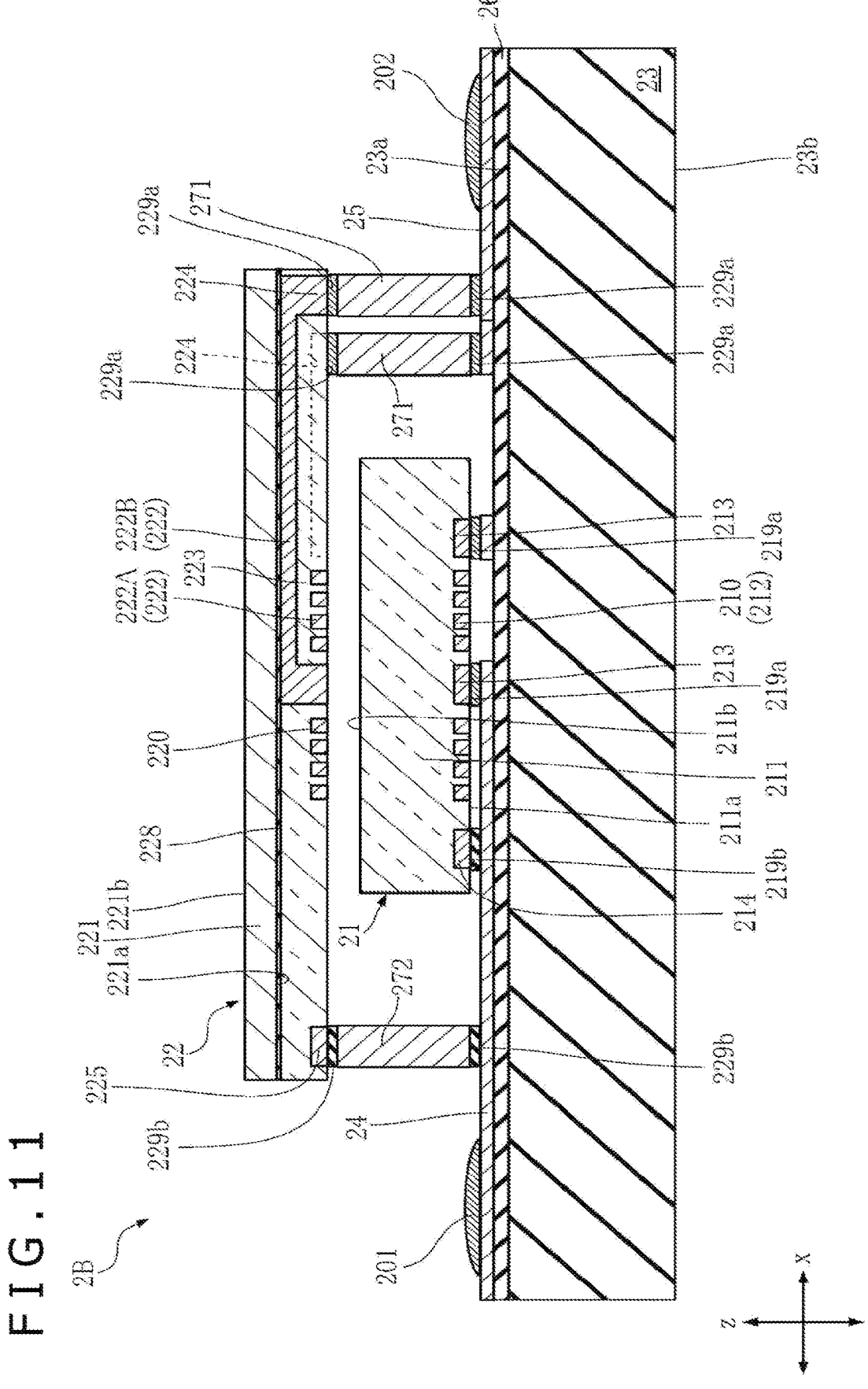

F I G . 1 3
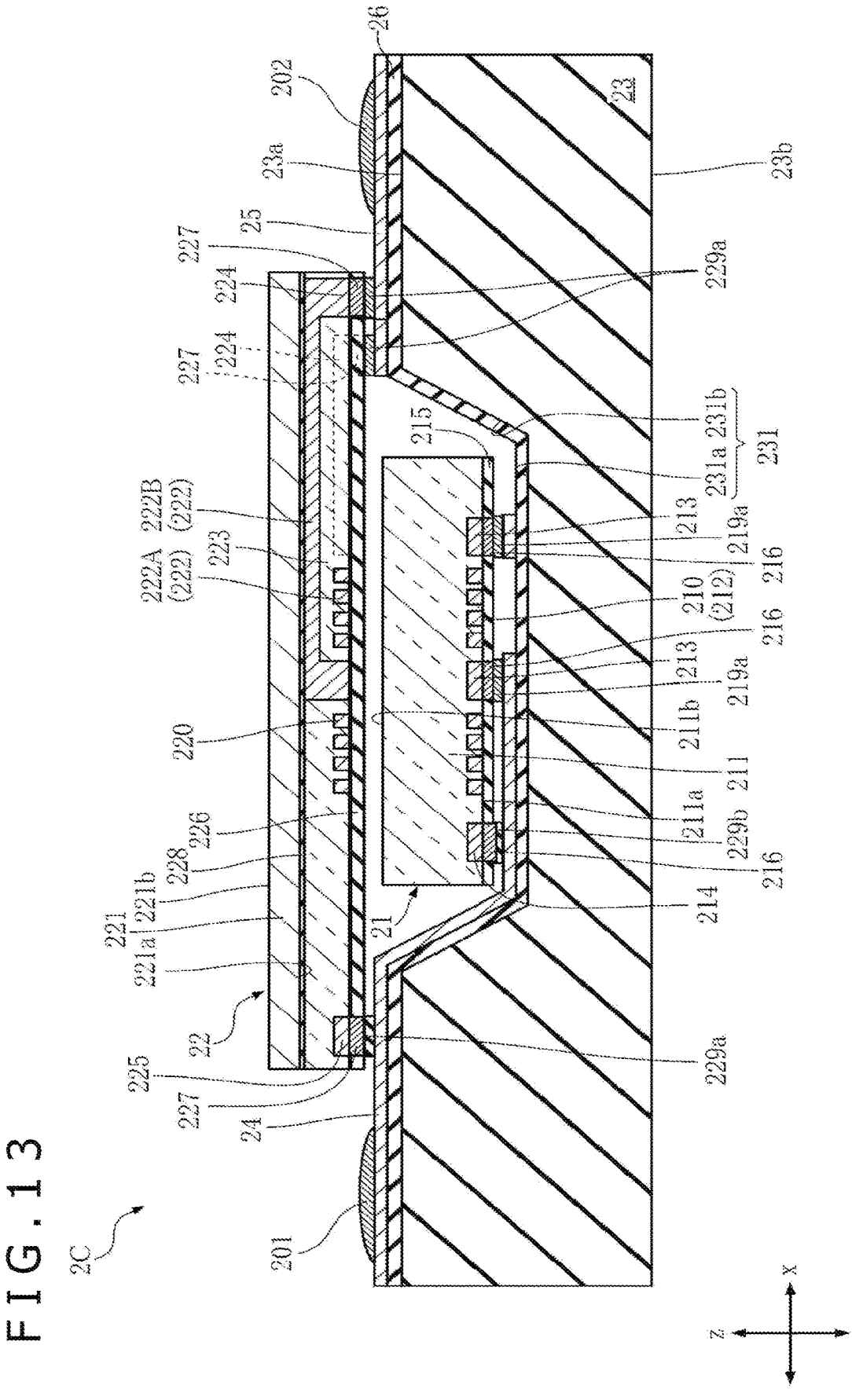

F I G . 1 6

F I G . 1 7
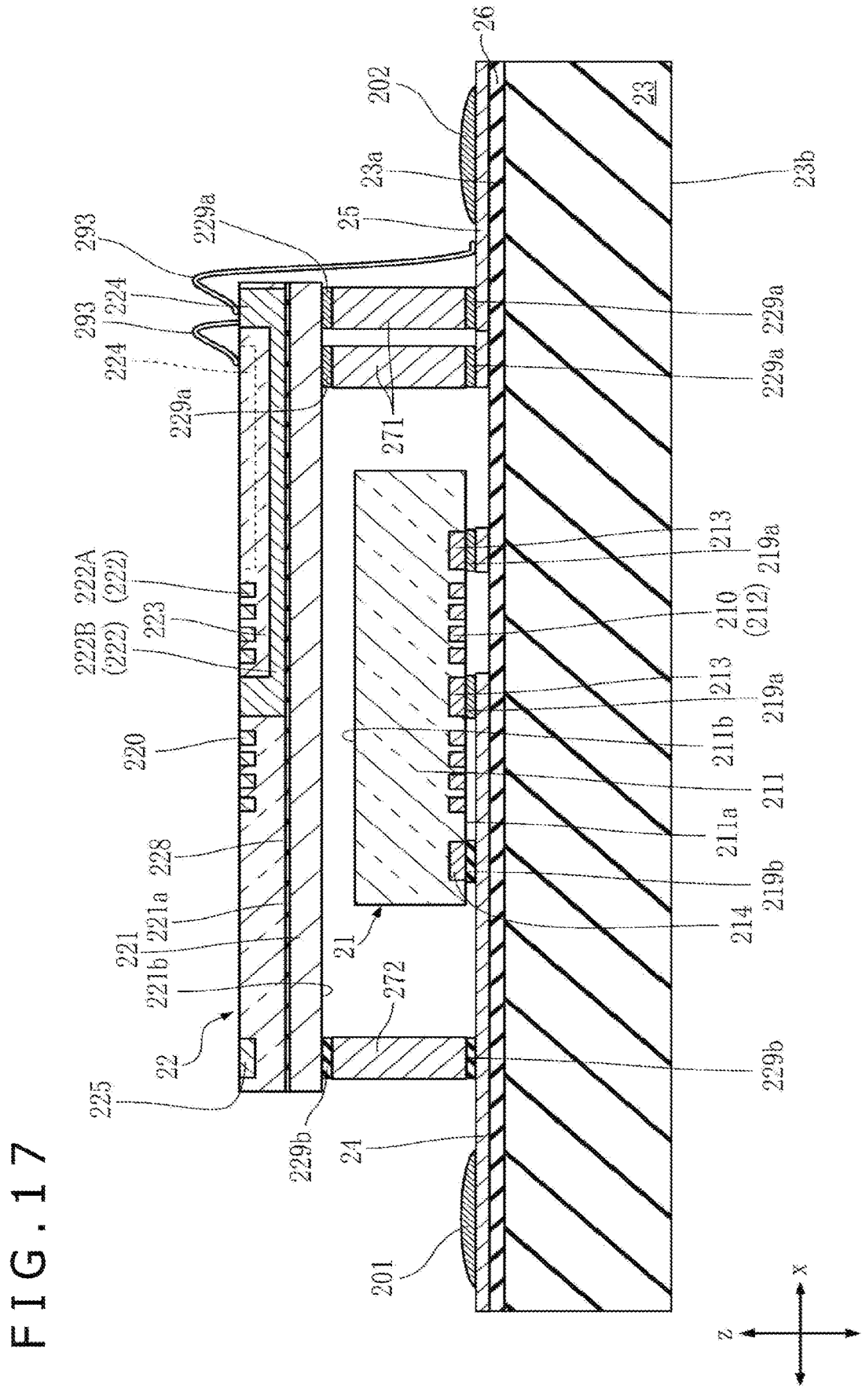

ELECTRONIC PART AND SEMICONDUCTOR DEVICE

CROSS REFERENCE TO RELATED APPLICATIONS

This application claims priority benefit of Japanese Patent Application No. JP 2021-028308 filed in the Japan Patent Office on Feb. 25, 2021. Each of the above-referenced applications is hereby incorporated herein by reference in its entirety.

BACKGROUND

The present disclosure relates to an electronic part and a semiconductor device.

A semiconductor device is used in an inverter apparatus used in an electric car, a hybrid car, a home appliance, or other equipment. The inverter apparatus includes, for example, a semiconductor device and switching elements, such as IGBTs (insulated gate bipolar transistors) and MOS-FETs (metal oxide semiconductor field effect transistors). The semiconductor device includes a control element and a drive element. In the inverter apparatus, a control signal output from an ECU (engine control unit) is input to the control element of the semiconductor device. The control element converts the control signal into a PWM (pulse width modulation) control signal and transmits the PWM control signal to the drive element. The drive element drives, for example, six switching elements at desirable timing based on the PWM control signal. In this way, three-phase alternating current power for motor drive is generated from direct current power of an in-vehicle battery.

In the semiconductor device, the power supply voltage supplied to the control element may be a low voltage (approximately 5 V), and the power supply voltage supplied to the drive element may be a high voltage (approximately 600 V or more). When the power supply voltage varies between two elements in this way, an insulating element may be used to transmit a signal between two elements. For example, a semiconductor integrated circuit that transmits a signal through an insulating element is disclosed in Japanese Patent Laid-Open No. 2013-51547. The semiconductor integrated circuit described in Japanese Patent Laid-Open No. 2013-51547 includes a transmission circuit, a reception circuit, and an insulating element. The transmission circuit is formed on a first semiconductor chip, and the reception circuit is formed on a second semiconductor chip. The insulating element is, for example, an inductor-type isolator including a primary coil and a secondary coil. The primary coil is electrically connected to the transmission circuit, and the secondary coil is electrically connected to the reception circuit.

SUMMARY

When the insulating element is an inductor type as in the semiconductor integrated circuit described in Japanese Patent Laid-Open No. 2013-51547, the same potential difference as the potential difference between the power supply voltage supplied to the transmission circuit (first semiconductor chip) and the power supply voltage supplied to the reception circuit (second semiconductor chip) is generated between the primary coil and the secondary coil. That is, the potential difference is generated inside the insulating element, and therefore, the dielectric strength of the insulating element needs to be improved to improve the dielectric strength of the semiconductor integrated circuit.

The present disclosure has been made in view of the circumstances, and it is desirable to provide an electronic part with improved dielectric strength. Additionally, it is desirable to provide a semiconductor device including an electronic part with improved dielectric strength.

A first aspect of the present disclosure provides an electronic part including a first substrate including a first base and a first coil, the first coil being electrically insulated from the first base, a second substrate including a second base and a second coil, the second coil being electrically insulated from the second base, and a support member that supports the first substrate and the second substrate, in which the first substrate is arranged between the second substrate and the support member in a thickness direction of the support member and overlaps the second substrate as viewed in the thickness direction, the first base is positioned between the first coil and the second coil in the thickness direction, and the first coil and the second coil are magnetically coupled.

A second aspect of the present disclosure provides a semiconductor device including the electronic part according to the first aspect, a conductive support member including a first island portion and a second island portion separated in an orthogonal direction orthogonal to the thickness direction, a first semiconductor element mounted on the first island portion and included in a first circuit, a second semiconductor element mounted on the second island portion and included in a second circuit, and a sealing resin that covers the electronic part, the first island portion, the second island portion, the first semiconductor element, and the second semiconductor element, in which the first coil is electrically connected to the first semiconductor element, the second coil is electrically connected to the second semiconductor element, and the first circuit and the second circuit are electrically insulated by the electronic part.

With the electronic part according to embodiments of the present disclosure, the dielectric strength can be improved. The semiconductor device according to the embodiments of the present disclosure includes the electronic part with improved dielectric strength, and the dielectric strength of the semiconductor device is improved.

BRIEF DESCRIPTION OF THE DRAWINGS

FIG. 1 is a plan view illustrating a semiconductor device according to a first embodiment;

FIG. 7 is a cross-sectional view along a line VII-VII in FIG. 2;

FIG. 9 is a cross-sectional view illustrating a detailed configuration example of the electronic part according to the first embodiment and is an enlarged cross-sectional view of main parts in FIG. 6;

FIG. 11 is a cross-sectional view illustrating a detailed configuration example of an electronic part according to the second embodiment;

FIG. 13 is a cross-sectional view illustrating a detailed configuration example of an electronic part according to the third embodiment;

FIG. 16 is a cross-sectional view illustrating a detailed configuration example of an electronic part according to a modification example;

FIG. 17 is a cross-sectional view illustrating a detailed configuration example of an electronic part according to a modification example;

FIG. 18 is a cross-sectional view illustrating a detailed configuration example of an electronic part according to a modification example;

Figure 2:
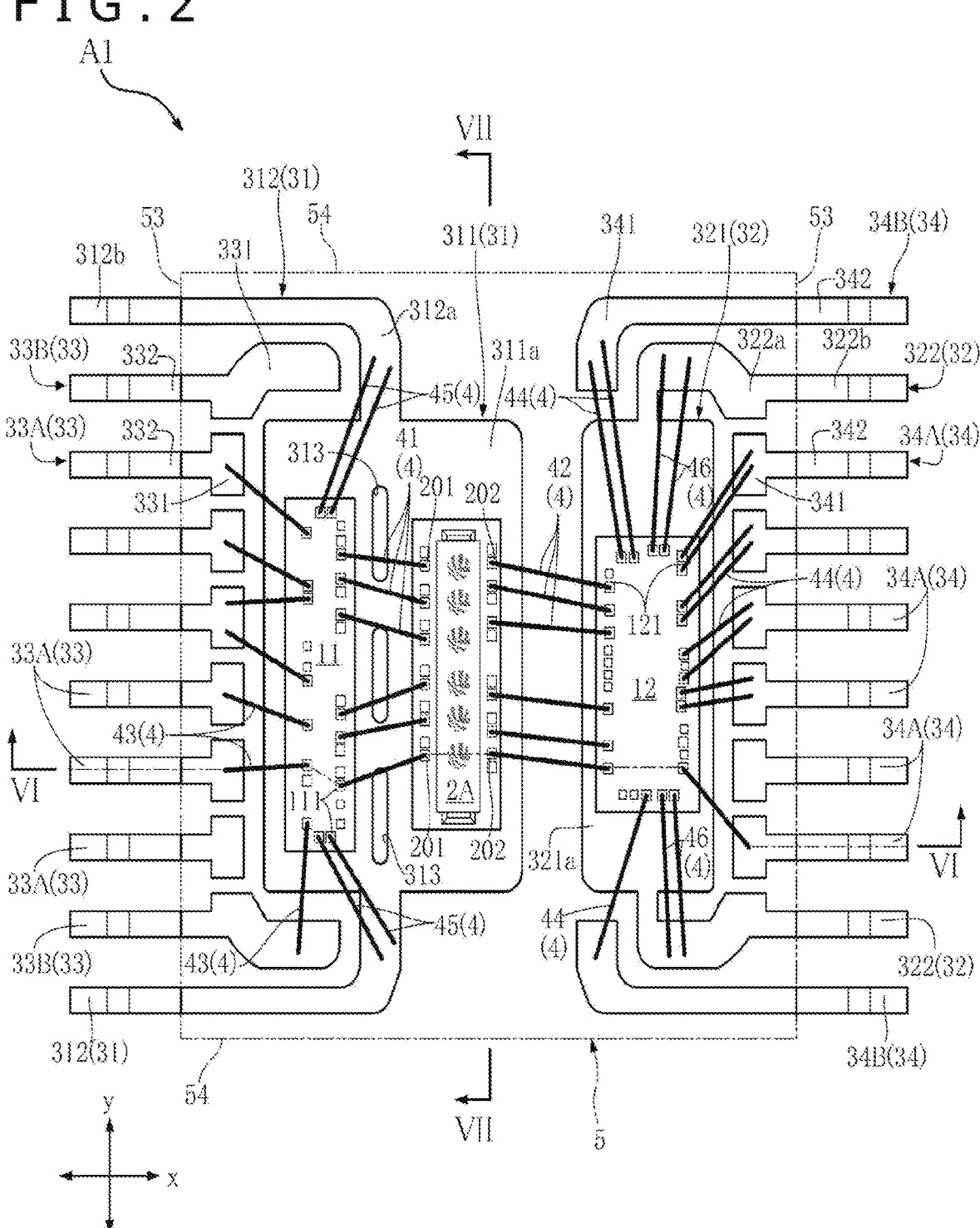
FIG. 2 depicts a sealing resin represented by an imaginary line in the plan view of FIG. 1.

DETAILED DESCRIPTION OF THE
PREFERRED EMBODIMENTS

Preferred embodiments of an electronic part and a semiconductor device of the present disclosure will be described with reference to the drawings. The same signs will be provided to the same or similar constituent elements, and duplicate description will be omitted.

FIGS. 1 to 9 illustrate a semiconductor device A1 according to a first embodiment. As illustrated in FIGS. 1 to 9, the semiconductor device A1 includes a first semiconductor element 11, a second semiconductor element 12, an electronic part 2A, a conductive support member 3, a plurality of connection members 4, and a sealing resin 5. The conductive support member 3 includes a first lead 31, a second lead 32, a plurality of third leads 33, and a plurality of fourth leads 34, and the plurality of connection members 4 include a plurality of first wires 41, a plurality of second wires 42, a plurality of third wires 43, a plurality of fourth wires 44, a plurality of fifth wires 45, and a plurality of six wires 46.

Figure 3:
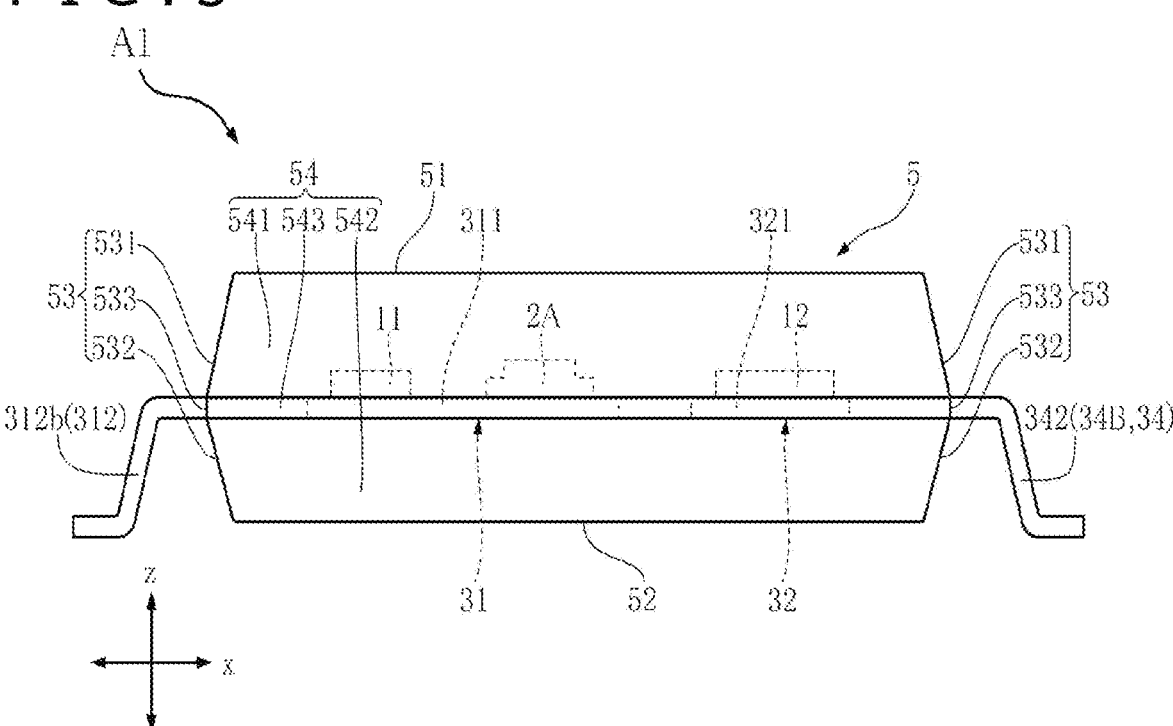
FIG. 3 is a front view illustrating the semiconductor device according to the first embodiment.
Figure 4:
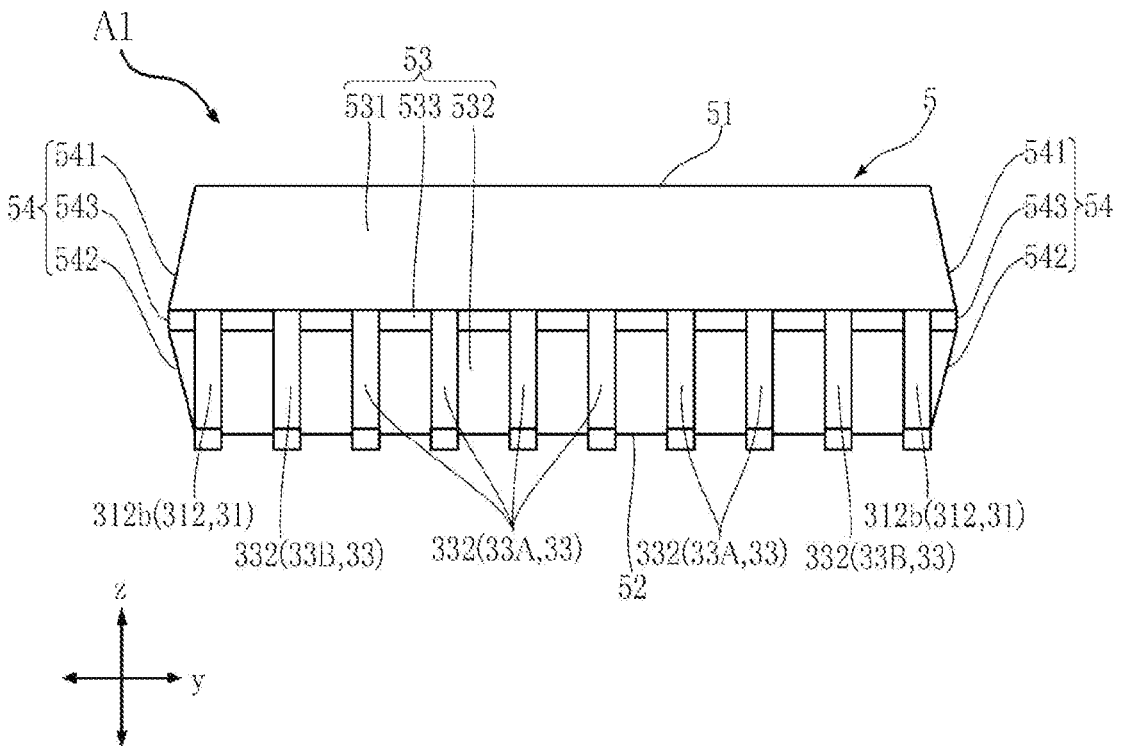
FIG. 4 is a left side view illustrating the semiconductor device according to the first embodiment.
Figure 5:
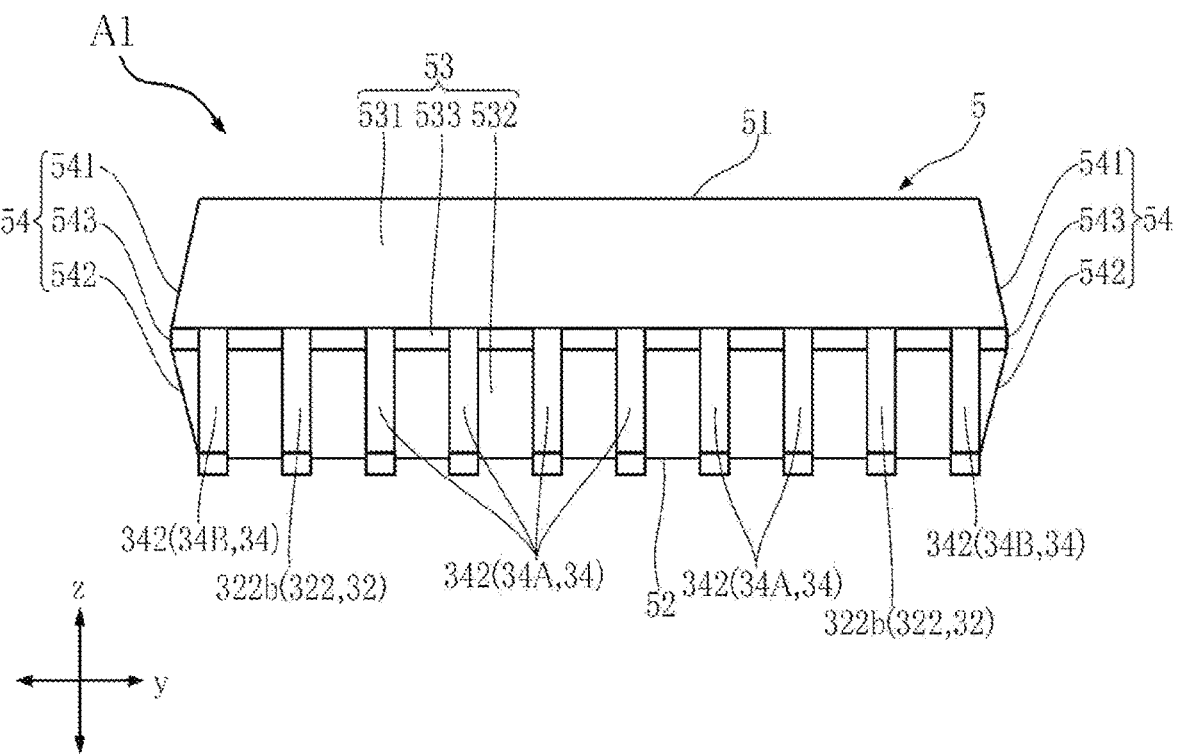
FIG. 5 is a right side view illustrating the semiconductor device according to the first embodiment.
Figure 6:
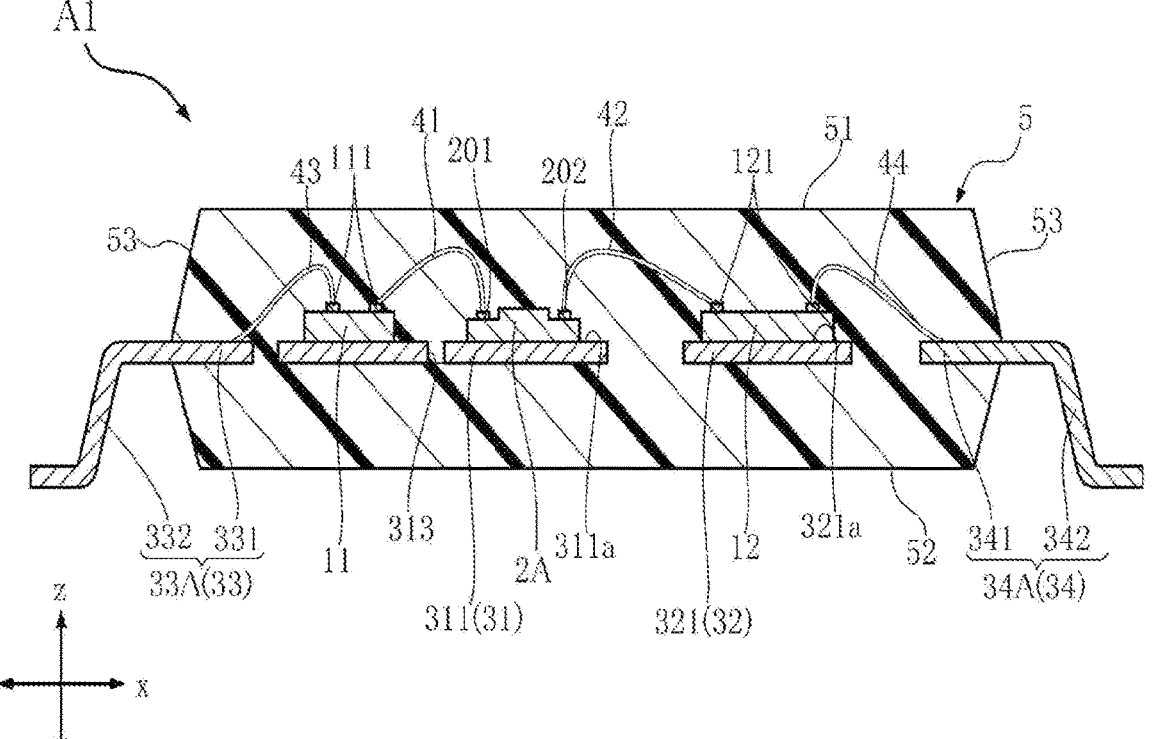
FIG. 6 is a cross-sectional view along a line VI-VI in FIG. 2.
Figure 8:
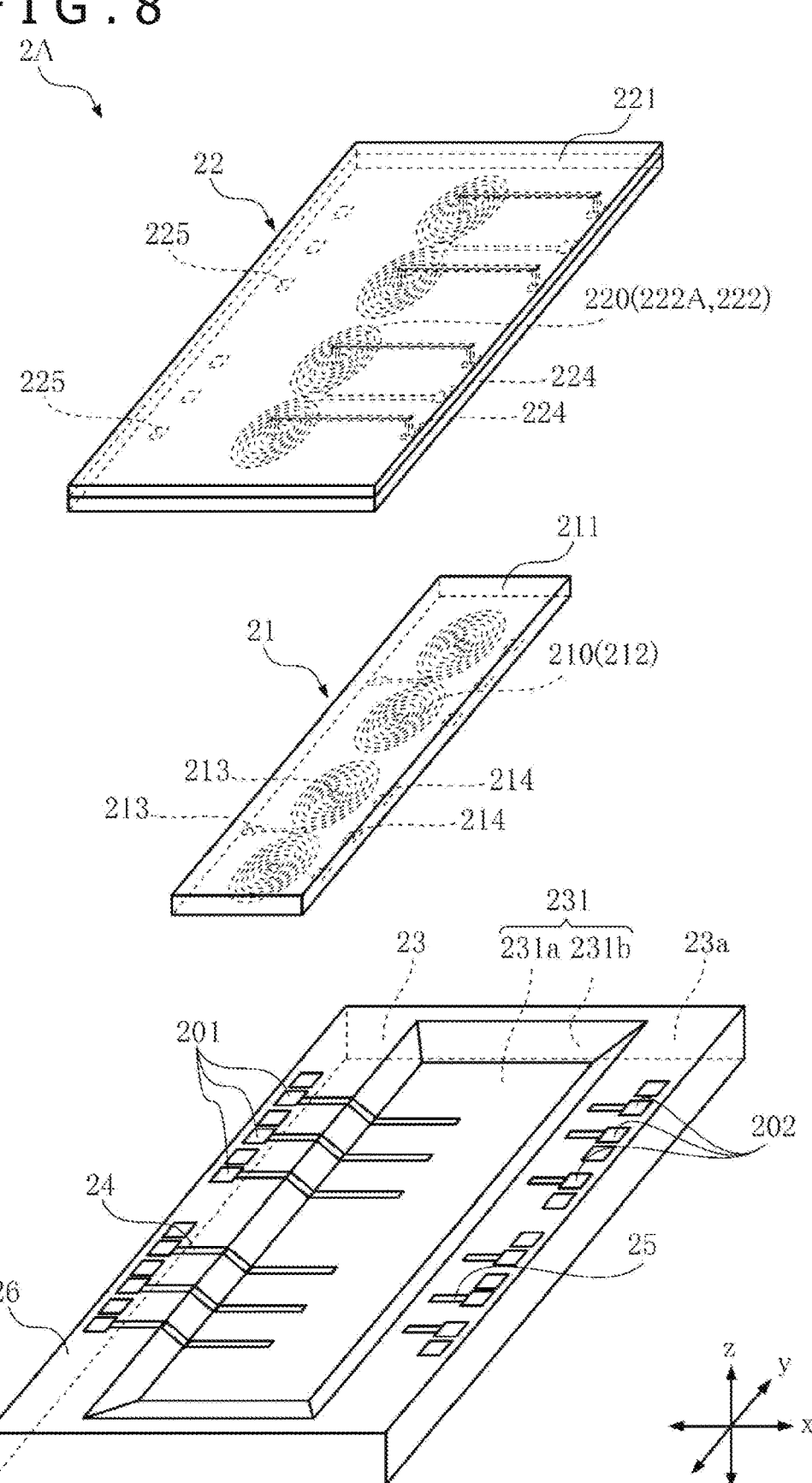
FIG. 8 is an exploded perspective view illustrating a detailed configuration example of an electronic part according to the first embodiment.
Figure 1:
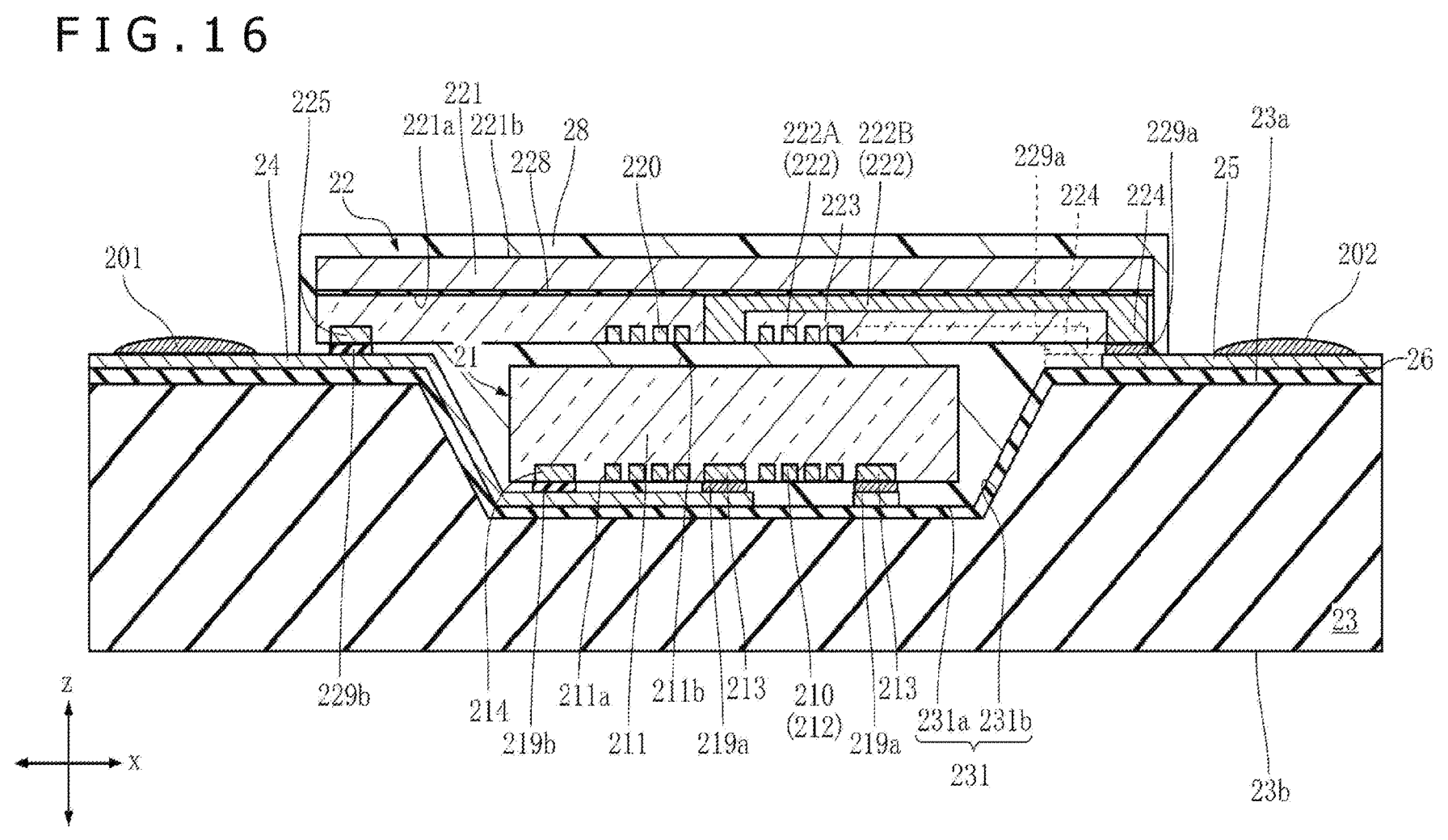

FIG. 1 is a plan view illustrating the semiconductor device A1. FIG. 2 depicts the sealing resin 5 represented by an imaginary line (two dot chain line) in the plan view of FIG. 1. FIG. 3 is a front view illustrating the semiconductor device A1. FIG. 4 is a left side view illustrating the semiconductor device A1. FIG. 5 is a right side view illustrating the semiconductor device A1. FIG. 6 is a cross-sectional view along a line VI-VI in FIG. 2. FIG. 7 is a cross-sectional view along a line VII-VII in FIG. 2. FIG. 8 is an exploded perspective view illustrating a detailed configuration example of the electronic part 2A. FIG. 9 is a cross-sectional view illustrating a detailed configuration example of the electronic part 2A and is an enlarged cross-sectional view of main parts in FIG. 6.

In the description of the semiconductor device A1, a thickness direction of each of the first semiconductor element 11, the second semiconductor element 12, the electronic part 2A, and the conductive support member 3 will be referred to as a "thickness direction z." One side in the thickness direction z will be referred to as "up" in some cases, and the other side in the thickness direction z will be referred to as "down" in some cases. In the following description, "in plan view" represents a view along the thickness direction z. A direction orthogonal to the thickness direction z will be referred to as a "first direction x." The first direction x is a horizontal direction in the plan view (see FIG. 1) of the semiconductor device A1. A direction orthogonal to both the thickness direction z and the first direction x will be referred to as a "second direction y." The second direction y is a vertical direction in the plan view (see FIG. 1) of the semiconductor device A1.

The semiconductor device A1 is mounted on, for example, the surface of a wiring substrate of an inverter apparatus of an electric car, a hybrid car, or other cars. The semiconductor device A1 controls a switching action of a switching element, such as an IGBT and a MOSFET. The package format of the semiconductor device A1 is an SOP (small outline package) as can be understood from FIGS. 1 and 3 to 5. However, the package format of the semiconductor device A1 is not limited to the SOP.

The first semiconductor element 11, the second semiconductor element 12, and the electronic part 2A are elements serving as a functional center of the semiconductor device A1. The first semiconductor element 11, the second semiconductor element 12, and the electronic part 2A are individual elements. The electronic part 2A is positioned between the first semiconductor element 11 and the second semiconductor element 12 in the first direction x. Each of the first semiconductor element 11, the second semiconductor element 12, and the electronic part 2A has a rectangular shape with the second direction y as the long side as viewed along the thickness direction z.

The first semiconductor element 11 is a controller (control element) of a gate driver that drives the switching element, such as an IGBT and a MOSFET. The first semiconductor element 11 includes a circuit that converts a control signal input from an ECU or other device into a PWM control signal, a transmission circuit that transmits the PWM control signal to the electronic part 2A, and a reception circuit that receives an electrical signal from the electronic part 2A.

As illustrated in FIGS. 2 and 6, the first semiconductor element 11 includes a plurality of pads 111. The plurality of pads 111 are provided on an upper surface of the first semiconductor element 11 (surface facing the same direction as a first mount surface 311a of a first island portion 311 of the first lead 31 to be described later). The composition of each of the plurality of pads 111 contains, for example, aluminum (Al).

The second semiconductor element 12 is a gate driver (drive element) that drives the switching element. The second semiconductor element 12 includes a reception circuit that receives a PWM control signal, a circuit that drives the switching element based on the PWM control signal, and a transmission circuit that transmits an electrical signal to the first semiconductor element 11. An example of the electrical signal includes an output signal from a temperature sensor arranged near the motor.

As illustrated in FIGS. 2 and 6, the second semiconductor element 12 includes a plurality of pads 121. The plurality of pads 121 are provided on an upper surface of the second semiconductor element 12 (surface facing the same direction as a second mount surface 321*a* of a second island portion 321 of the second lead 32 to be described later). The composition of each of the plurality of pads 121 contains, for example, aluminum.

The electronic part 2A is an element (insulating element) that transmits a PWM control signal or other electrical signals in an insulated state. The electronic part 2A is a coupled-inductor insulating element. The electronic part 2A inductively couples two inductors (a first coil 210 and a second coil 220 to be described later) to transmit an electrical signal in an insulated state. As illustrated in FIGS. 2 and 6, the electronic part 2A includes a plurality of pads 201 and 202. Inside the electronic part 2A, each pad 201 is electrically connected to the first coil 210, and each pad 202 is electrically connected to the second coil 220. The composition of each of the plurality of pads 201 and 202 contains, for example, aluminum. Other detailed configurations of the electronic part 2A will be to be described later.

In the semiconductor device A1, the second semiconductor element 12 needs a power supply voltage higher than a power supply voltage requested for the first semiconductor element 11. Therefore, a significant potential difference is generated between the first semiconductor element 11 and the second semiconductor element 12. Thus, a first circuit including the first semiconductor element 11 as a constituent element and a second circuit including the second semiconductor element 12 as a constituent element are insulated from each other by the electronic part 2A. In addition to the first semiconductor element 11, the constituent elements of the first circuit include the first lead 31, the plurality of third leads 33, the plurality of first wires 41, the plurality of third wires 43, and the plurality of fifth wires 45. In addition to the second semiconductor element 12, the constituent elements of the second circuit include the second lead 32, the plurality of fourth leads 34, the plurality of second wires 42, the plurality of fourth wires 44, and the plurality of sixth wires 46. The potential of the first circuit and the potential of the second circuit are different from each other. In the semiconductor device A1, the potential of the second circuit is higher than the potential of the first circuit. Based on this, the electronic part 2A relays signals between the first circuit and the second circuit. For example, while the voltage applied to the ground of the first semiconductor element 11 is approximately 0 V in an inverter apparatus of an electric car or a hybrid car, the voltage applied to the ground of the second semiconductor element 12 may transiently become equal to or greater than 600 V. The voltage applied to the ground of the second semiconductor element 12 may become equal to or greater than 3750 V depending on the specification of the inverter apparatus.

The conductive support member 3 provides conduction paths between (a) the first semiconductor element 11, the second semiconductor element 12, and the electronic part 2A and (b) the wiring substrate on which the semiconductor device A1 is mounted. The conductive support member 3 is obtained from, for example, the same lead frame. Although the lead frame contains, for example, copper or a copper alloy, the lead frame may contain other metal material. The conductive support member 3 includes the first lead 31, the second lead 32, the plurality of third leads 33, and the plurality of fourth leads 34 as described above.

The first lead 31 and the second lead 32 are separated from each other in the first direction x as illustrated in FIGS. 1 and 2. In the semiconductor device A1, the first semiconductor element 11 and the electronic part 2A are mounted on the first lead 31, and the second semiconductor element 12 is mounted on the second lead 32.

The first lead 31 includes the first island portion 311 and two first terminal portions 312 as illustrated in FIG. 2.

The first island portion 311 includes the first mount surface 311*a* facing the thickness direction z. The first semiconductor element 11 and the electronic part 2A are bonded to the first mount surface 311*a* through a conductive bonding material not illustrated (for example, solder, metal paste, or sintered metal). The first island portion 311 is covered by the sealing resin 5. In the illustrated example, the first island portion 311 has a rectangular shape in plan view. The thickness of the first island portion 311 is, for example, equal to or greater than 100 μm and equal to or smaller than 300 μm.

A plurality of through holes 313 are formed on the first island portion 311. Each of the plurality of through holes 313 penetrates the first island portion 311 in the thickness direction z and extends along the second direction y. At least one of the plurality of through holes 313 is positioned between the first semiconductor element 11 and the electronic part 2A in plan view. The plurality of through holes 313 are arrayed along the second direction y.

As illustrated in FIG. 2, the two first terminal portions 312 extend from both sides of the first island portion 311 in the second direction y. The two first terminal portions 312 are separated from each other in the second direction y. At least one of the two first terminal portions 312 is electrically connected to the ground of the first semiconductor element 11 through the fifth wire 45. Each of the two first terminal portions 312 includes a covered portion 312*a* and an exposed portion 312*b*. The covered portion 312*a* is connected to the first island portion 311 and covered by the sealing resin 5. The exposed portion 312*b* is connected to the covered portion 312*a* and exposed from the sealing resin 5. The exposed portion 312*b* extends along the first direction x in plan view. As illustrated in FIG. 3, the exposed portion 312*b* is bent in a gull wing shape as viewed along the second direction y. Plating, such as tin (Sn) plating, may be applied to the surface of the exposed portion 312*b*.

The second lead 32 includes the second island portion 321 and two second terminal portions 322 as illustrated in FIG. 2.

The second island portion 321 includes the second mount surface 321*a* facing the thickness direction z as illustrated in FIG. 6. The second semiconductor element 12 is bonded to the second mount surface 321*a* through a conductive bonding material not illustrated (for example, solder, metal paste, or sintered metal). The second island portion 321 is covered by the sealing resin 5. In the illustrated example, the second island portion 321 has a rectangular shape in plan view. The thickness of the second island portion 321 is, for example, equal to or greater than 100 μm and equal to or smaller than 300 μm similarly to the first island portion 311.

As illustrated in FIG. 2, the two second terminal portions 322 extend from both sides of the second island portion 321 in the second direction y. The two second terminal portions 322 are separated from each other in the second direction y. At least one of the two second terminal portions 322 is electrically connected to the ground of the second semiconductor element 12 through the sixth wire 46. Each of the two second terminal portions 322 includes a covered portion 322*a* and an exposed portion 322*b*. The covered portion 322*a* is connected to the second island portion 321 and covered by the sealing resin 5. The exposed portion 322*b* is connected to the covered portion 322*a* and exposed from the sealing resin 5. The exposed portion 322*b* extends along the first direction x in plan view. As illustrated in FIG. 3, the exposed portion 322*b* is bent in a gull wing shape as viewed along the second direction y. Plating, such as tin plating, may be applied to the surface of the exposed portion 322*b*.

The plurality of third leads 33 are positioned on the opposite side of the second island portion 321 of the second lead 32 in the first direction x with respect to the first island portion 311 of the first lead 31 as illustrated in FIGS. 1 and 2. The plurality of third leads 33 are arrayed along the second direction y. At least one of the plurality of third leads 33 is electrically connected to the first semiconductor element 11 through the second wire 42. The plurality of third leads 33 include a plurality of intermediate leads 33A and two side leads 33B. Each of the two side leads 33B is positioned between one of the two first terminal portions 312 of the first lead 31 and the intermediate lead 33A positioned closest from the first terminal portion 312 in the second direction y.

As illustrated in FIGS. 2 and 6, each of the plurality of third leads 33 (the plurality of intermediate leads 33A and the two side leads 33B) includes a covered portion 331 and an exposed portion 332. The covered portion 331 is covered by the sealing resin 5. The dimension of each covered portion 331 of the two side leads 33B in the first direction x is larger than the dimension of each covered portion 331 of the plurality of intermediate leads 33A in the first direction x.

As illustrated in FIGS. 2 and 6, the exposed portion 332 is connected to the covered portion 331 and exposed from the sealing resin 5. The exposed portion 332 extends along the first direction x in plan view. The exposed portion 332 is bent in a gull wing shape as viewed along the second direction y. The shape of the exposed portion 332 is equal to the shape of the exposed portion 312*b* of each first terminal portion 312 of the first lead 31. Plating, such as tin plating, may be applied to the surface of the exposed portion 332.

The plurality of fourth leads 34 are positioned on the opposite side of the plurality of third leads 33 in the first direction x with respect to the first island portion 311 of the first lead 31 as illustrated in FIGS. 1 and 2. The plurality of fourth leads 34 are arrayed along the second direction y. At least one of the plurality of fourth leads 34 is electrically connected to the second semiconductor element 12 through the fourth wire 44. The plurality of fourth leads 34 include a plurality of intermediate leads 34A and two side leads 34B. The two side leads 34B are positioned on both sides of the plurality of intermediate leads 34A in the second direction y. One of the two second terminal portions 322 of the second lead 32 is positioned between one of the two side leads 34B and the intermediate lead 34A positioned closest from the side lead 34B in the second direction y.

As illustrated in FIGS. 2 and 6, each of the plurality of fourth leads 34 (the plurality of intermediate leads 34A and the two side leads 34B) includes a covered portion 341 and an exposed portion 342. The covered portion 341 is covered by the sealing resin 5. The dimension of each covered portion 341 of the two side leads 34B in the first direction x is larger than the dimension of each covered portion 341 of the plurality of intermediate leads 34A in the first direction x.

As illustrated in FIGS. 2 and 6, the exposed portion 342 is connected to the covered portion 341 and exposed from the sealing resin 5. The exposed portion 342 extends along the first direction x in plan view. As illustrated in FIG. 3, the exposed portion 342 is bent in a gull wing shape as viewed along the second direction y. The shape of the exposed portion 342 is equal to the shape of each exposed portion 322*b* of the two second terminal portions 322 of the second lead 32. Plating, such as tin plating, may be applied to the surface of the exposed portion 342.

Each of the plurality of connection members 4 electrically connects two sections separated from each other. The plurality of connection members 4 include the plurality of first wires 41, the plurality of second wires 42, the plurality of third wires 43, the plurality of fourth wires 44, the plurality of fifth wires 45, and the plurality of sixth wires 46 as described above.

Each of the plurality of first wires 41, the plurality of second wires 42, the plurality of third wires 43, the plurality of fourth wires 44, the plurality of fifth wires 45, and the plurality of sixth wires 46 is made of a metal material, and the metal material contains, for example, any one of gold, copper, and aluminum. The plurality of connection members 4 may include bonding ribbons or plate-shaped metal members instead of the plurality of first wires 41, the plurality of second wires 42, the plurality of third wires 43, the plurality of fourth wires 44, the plurality of fifth wires 45, and the plurality of sixth wires 46 as necessary.

Each of the plurality of first wires 41 is bonded to any one of the plurality of pads 111 of the first semiconductor element 11 and any one of the plurality of pads 201 of the electronic part 2A. Each first wire 41 electrically connects the first semiconductor element 11 and the electronic part 2A. The plurality of first wires 41 are arrayed along the second direction y.

Each of the plurality of second wires 42 is bonded to any one of the plurality of pads 121 of the second semiconductor element 12 and any one of the plurality of pads 202 of the electronic part 2A. Each second wire 42 electrically connects the second semiconductor element 12 and the electronic part 2A. The plurality of second wires 42 are arrayed along the second direction y. Each of the plurality of second wires 42 goes over the first island portion 311 of the first lead 31 and the second island portion 321 of the second lead 32.

Each of the plurality of third wires 43 is bonded to any one of the plurality of pads 111 of the first semiconductor element 11 and the covered portion 331 of any one of the plurality of third leads 33. Each third wire 43 electrically connects the first semiconductor element 11 and any one of the plurality of third leads 33.

Each of the plurality of fourth wires 44 is bonded to any one of the plurality of pads 121 of the second semiconductor element 12 and the covered portion 341 of any one of the plurality of fourth leads 34. Each fourth wire 44 electrically connects the second semiconductor element 12 and any one of the plurality of fourth leads 34.

Each of the plurality of fifth wires 45 is bonded to any one of the plurality of pads 111 of the first semiconductor element 11 and the covered portion 312*a* of one of the two first terminal portions 312. Each fifth wire 45 electrically connects the first semiconductor element 11 and the first lead 31.

Each of the plurality of sixth wires 46 is bonded to any one of the plurality of pads 121 of the second semiconductor element 12 and the covered portion 322*a* of one of the two second terminal portions 322. Each sixth wire 46 electrically connects the second semiconductor element 12 and the second lead 32.

The sealing resin 5 covers the first semiconductor element 11, the second semiconductor element 12, the electronic part 2A, a part of the conductive support member 3, and the plurality of connection members 4 as illustrated in FIG. 1. The sealing resin 5 is electrically insulative. The sealing resin 5 insulates the first lead 31 and the second lead 32. The sealing resin 5 is made of, for example, a material containing a black epoxy resin. In the illustrated example, the sealing resin 5 has a rectangular shape in plan view.

As illustrated in FIGS. 3 to 5, the sealing resin 5 includes a top surface 51, a bottom surface 52, a pair of first side surfaces 53, and a pair of second side surfaces 54.

As illustrated in FIGS. 3 to 5, the top surface 51 and the bottom surface 52 are separated from each other in the thickness direction z. The top surface 51 and the bottom surface 52 face opposite sides in the thickness direction z. Each of the top surface 51 and the bottom surface 52 is substantially flat.

As illustrated in FIGS. 3 to 5, the pair of first side surfaces 53 are connected to the top surface 51 and the bottom surface 52 and separated from each other in the first direction x. Each exposed portion 312b of the two first terminal portions 312 (first lead 31) and each exposed portion 332 of the plurality of third leads 33 are exposed from one of the pair of first side surfaces 53 positioned on one side in the first direction x. Each exposed portion 322b of the two second terminal portions 322 (second lead 32) and each exposed portion 342 of the plurality of fourth leads 34 are exposed from the other of the pair of first side surfaces 53 positioned on the other side in the first direction x.

As illustrated in FIGS. 3 to 5, each of the pair of first side surfaces 53 includes a first upper portion 531, a first lower portion 532, and a first intermediate portion 533. One side of the first upper portion 531 in the thickness direction z is connected to the top surface 51, and the other side in the thickness direction z is connected to the first intermediate portion 533. The first upper portion 531 is inclined to the top surface 51. One side of the first lower portion 532 in the thickness direction z is connected to the bottom surface 52, and the other side in the thickness direction z is connected to the first intermediate portion 533. The first lower portion 532 is inclined to the bottom surface 52. One side of the first intermediate portion 533 in the thickness direction z is connected to the first upper portion 531, and the other side in the thickness direction z is connected to the first lower portion 532. In-plane directions of the first intermediate portion 533 include the thickness direction z and the second direction y. The first intermediate portion 533 is positioned outside of the top surface 51 and the bottom surface 52 in plan view. Each exposed portion 312b of the two first terminal portions 312 (first lead 31), each exposed portion 322b of the two second terminal portions 322 (second lead 32), each exposed portion 332 of the plurality of third leads 33, and each exposed portion 342 of the plurality of fourth leads 34 are exposed from the first intermediate portions 533 of the pair of first side surfaces 53.

As illustrated in FIGS. 3 to 5, the pair of second side surfaces 54 are connected to the top surface 51 and the bottom surface 52 and separated from each other in the second direction y. As illustrated in FIG. 1, the first lead 31, the second lead 32, the plurality of third leads 33, and the plurality of fourth leads 34 are separated from the pair of second side surfaces 54.

As illustrated in FIGS. 3 to 5, each of the pair of second side surfaces 54 includes a second upper portion 541, a second lower portion 542, and a second intermediate portion 543. One side of the second upper portion 541 in the thickness direction z is connected to the top surface 51, and the other side in the thickness direction z is connected to the second intermediate portion 543. The second upper portion 541 is inclined to the top surface 51. One side of the second lower portion 542 in the thickness direction z is connected to the bottom surface 52, and the other side in the thickness direction z is connected to the second intermediate portion 543. The second lower portion 542 is inclined to the bottom surface 52. One side of the second intermediate portion 543 in the thickness direction z is connected to the second upper portion 541, and the other side in the thickness direction z is connected to the second lower portion 542. In-plane directions of the second intermediate portion 543 include the thickness direction z and the second direction y. The second intermediate portion 543 is positioned outside of the top surface 51 and the bottom surface 52 in plan view.

A motor driver circuit in the inverter apparatus generally includes a half bridge circuit including a low-side (low potential side) switching element and a high-side (high potential side) switching element. The switching elements are MOSFETs in the case described below. In the low-side switching element, the reference potential of the source of the switching element and the reference potential of the gate driver that drives the switching element are the ground. In the high-side switching element, the reference potential of the source of the switching element and the reference potential of the gate driver that drives the switching element correspond to the potential of the output node of the half bridge circuit. The potential of the output node varies according to the drive of the high-side switching element and the low-side switching element, and therefore, the reference potential of the gate driver that drives the high-side switching element varies. The reference potential is equivalent to the voltage (for example, equal to or greater than 600 V) applied to the drain of the high-side switching element when the high-side switching element is on. The ground of the first semiconductor element 11 and the ground of the second semiconductor element 12 are separated in the semiconductor device A1. Therefore, a voltage equivalent to the voltage applied to the drain of the high-side switching element is transiently applied to the ground of the second semiconductor element 12 when the semiconductor device A1 is used as the gate driver that drives the high-side switching element.

Next, a detailed configuration example of the electronic part 2A will be described.

As illustrated in FIGS. 8 and 9, the electronic part 2A includes a first substrate 21, a second substrate 22, a support member 23, a first wiring portion 24, a second wiring portion 25, and an insulating film 26. The electronic part 2A also includes the plurality of pads 201 and 202 as described above.

The support member 23 supports the first substrate 21 and the second substrate 22. The support member 23 includes, for example, an intrinsic semiconductor, and the support member 23 is insulative. The support member 23 contains, for example, silicon as a constituent material. The composition of the support member 23 is not limited to the material containing silicon, and the composition may contain other insulating substrate material (such as a glass epoxy resin and ceramic). The support member 23 has, for example, a rectangular shape in plan view. The support member 23 includes a third main surface 23a, a third back surface 23b, and a recessed portion 231.

The third main surface 23a and the third back surface 23b are separated in the thickness direction z. The clearance between the third main surface 23a and the third back surface 23b along the thickness direction z is, for example, equal to or greater than 700 μm and equal to or smaller than 750 μm. The third main surface 23a faces one side (upper side) in the thickness direction z, and the third back surface 23b faces the other side (lower side) in the thickness direction z. Each of the third main surface 23a and the third back surface 23b is flat. The third main surface 23a has a frame shape surrounding the recessed portion 231 in plan view. The third back surface 23b faces the first island portion 311.

The recessed portion 231 is recessed from the third main surface 23a in the thickness direction z. Part or all of the first substrate 21 is housed in the recessed portion 231. A part of the first substrate 21 is housed in the recessed portion 231 in the example illustrated in FIG. 9. The recessed portion 231 is formed by, for example, anisotropic etching. The recessed portion 231 may be formed by other etching, laser processing, grinding, or other method instead of the anisotropic etching.

As illustrated in FIGS. 8 and 9, the recessed portion 231 includes a bottom surface 231a and an inclined surface 231b. The bottom surface 231a is flat, and the bottom surface 231a faces the same direction as the third main surface 23a in the thickness direction z. The clearance between the third main surface 23a and the bottom surface 231a in the thickness direction z, that is, the depth of the recessed portion 231 is, for example, equal to or greater than 100 μm and equal to or smaller than 200 μm. The inclined surface 231b is inclined to the third main surface 23a and the bottom surface 231a. The inclination angle of the inclined surface 231b with respect to the third main surface 23a is 54.7 degrees when the recessed portion 231 is formed by anisotropic etching. The inclined surface 231b has a frame shape surrounding the bottom surface 231a in plan view.

The first substrate 21 is separated from the second substrate 22. The first substrate 21 is arranged between the second substrate 22 and the support member 23 in the thickness direction z. The first substrate 21 overlaps the second substrate 22 as viewed in the thickness direction z. The first substrate 21 has, for example, a rectangular shape in plan view. At least a part of the first substrate 21 is housed in the recessed portion 231. The dimension of the first substrate 21 along the thickness direction z is, for example, equal to or greater than 100 μm and equal to or smaller than 150 μm. The first substrate 21 includes a first base 211 and a wiring layer 212.

The first base 211 contains an insulating material. The first base 211 contains, for example, glass as a constituent material. The glass contains, for example, $SiO_2$. The glass of the first base 211 may contain fluorine to improve the dielectric strength of the first base 211. The first base 211 supports the wiring layer 212.

The first base 211 includes a first main surface 211a and a first back surface 211b. The first main surface 211a and the first back surface 211b are separated in the thickness direction z. As illustrated in FIG. 9, the first main surface 211a faces the support member 23, and the first back surface 211b faces the second substrate 22.

The wiring layer 212 is formed on the first main surface 211a of the first base 211. The wiring layer 212 may be formed on the first main surface 211a. The wiring layer 212 contains copper or a copper alloy. The wiring layer 212 includes a plurality of first coils 210, a plurality of first terminal portions 213, and a plurality of first pad portions 214. Note that the number of the first coils 210 may be one instead of two or more.

The wiring layer 212 is formed, for example, as follows. First, a trench is formed on the first base 211. The trench is formed on a part of the first base 211 closer to the first main surface 211a where the wiring layer 212 is to be formed. Next, a sputtering method is used to form a seed oxide film, and photolithography and plating are applied to form the wiring layer 212 in the trench. The method of forming the wiring layer 212 is an example, and the method is not limited to such a method.

Each of the plurality of first coils 210 is a planar coil and is wound in a spiral shape in plan view. Although each first coil 210 has a circular shape in plan view, the first coil 210 may have a rectangular shape. The first base 211 contains an insulating material in the present embodiment, and therefore, each first coil 210 and the first base 211 are electrically insulated.

Each of the plurality of first terminal portions 213 is electrically connected to any one of the plurality of first coils 210. Each first terminal portion 213 is bonded to the first wiring portion 24 through a conductive bonding material 219a. The conductive bonding material 219a contains, for example, solder, metal paste, or sintered metal. The plurality of first terminal portions 213 include portions that serve as input ends of the current to the first coils 210 and portions that serve as output ends of the current from the first coils 210.

The plurality of first pad portions 214 are separated and insulated from both the plurality of first coils 210 and the plurality of first terminal portions 213. Each of the plurality of first pad portions 214 is bonded to one of the first wiring portion 24 and the insulating film 26 through an insulating bonding material 219b. The entire insulating bonding material 219b may be made of an insulating material, or the insulating bonding material 219b may include a conductive material surface entirely covered by the insulating material. Each first pad portion 214 is positioned closer to one side in the first direction x with respect to each first terminal portion 213.

The second substrate 22 has, for example, a rectangular shape in plan view. The second substrate 22 is arranged on the third main surface 23a. The second substrate 22 goes over the recessed portion 231 in the first direction x. The dimension of the second substrate 22 along the thickness direction z is, for example, equal to or greater than 150 μm and equal to or smaller than 300 μm. The second substrate 22 includes a second base 221, a plurality of wiring layers 222, and an interlayer insulating film 223.

The second base 221 contains, for example, silicon as a constituent material. The second base 221 supports the plurality of wiring layers 222, and the interlayer insulating film 223.

The second base 221 includes a second main surface 221a and a second back surface 221b. The second main surface 221a and the second back surface 221b are separated in the thickness direction z. As illustrated in FIG. 9, the second main surface 221a faces the first substrate 21 and the support member 23. As illustrated in FIG. 9, an insulating film 228 is formed on the second main surface 221a. Although the insulating film 228 is, for example, a silicon oxide film, the insulating film 228 may contain other insulating material. The insulating film 228 is provided to prevent unintentional short circuit in the plurality of wiring layers 222 through the second base 221. Note that the insulating film 228 may cover the surface of the entire second base 221, instead of only the second main surface 221a.

The plurality of wiring layers 222 are formed on the second main surface 221a of the second base 221 through the insulating film 228. The plurality of wiring layers 222 are layered to sandwich the interlayer insulating film 223. In the example illustrated in FIG. 9, the second substrate 22 includes two wiring layers 222 and one interlayer insulating film 223 placed between them. The plurality of wiring layers 222 are electrically connected to each other through a through electrode (not illustrated) appropriately penetrating the interlayer insulating film 223. Each of the plurality of wiring layers 222 contains, for example, copper or a copper alloy. The thickness of the interlayer insulating film 223 is, for example, approximately 2 μm.

As illustrated in FIG. 9, the plurality of wiring layers 222 include a first wiring layer 222A and a second wiring layer 222B. As illustrated in FIG. 9, the second wiring layer 222B is a surface layer of the plurality of wiring layers 222 closer to the second base 221 in the thickness direction z. The second wiring layer 222B is in contact with the second main surface 221a. As illustrated in FIG. 9, the first wiring layer 222A is a surface layer of the plurality of wiring layers 222 farther from the second base 221 in the thickness direction z and is a surface layer closer to the first base 211 in the thickness direction z. The first wiring layer 222A includes the plurality of second coils 220, a plurality of second terminal portions 224, and a plurality of second pad portions 225 as illustrated in FIGS. 8 and 9. Note that the number of the second coils 220 may be one instead of two or more.

Each of the plurality of second coils 220 is a planar coil and is wound in a spiral shape in plan view similarly to each first coil 210. Although each second coil 220 has a circular shape in plan view, each second coil 220 may have a rectangular shape. The insulating film 228 exists between the second base 221 and the plurality of wiring layers 222 in the present embodiment, and therefore, each second coil 220 and the second base 221 are electrically insulated.

Each of the plurality of second terminal portions 224 is electrically connected to any one of the plurality of second coils 220. Each second terminal portion 224 is bonded to the second wiring portion 25 through a conductive bonding material 229a. The conductive bonding material 229a contains, for example, solder, metal paste, or sintered metal. The plurality of second terminal portions 224 include portions that serve as input ends of the current to the second coils 220 and portions that serve as output ends of the current from the second coils 220.

The plurality of second pad portions 225 are separated and insulated from both the plurality of second coils 220 and the plurality of second terminal portions 224. Each of the plurality of second pad portions 225 is bonded to one of the second wiring portion 25 and the insulating film 26 through an insulating bonding material 229b. The entire insulating bonding material 229b may be made of an insulating material, or the insulating bonding material 229b may include a conductive material surface entirely covered by the insulating material. In the example illustrated in FIGS. 8 and 9, the plurality of second pad portions 225 are positioned on the opposite side of the second terminal portions 224 with respect to the second coil 220 in the first direction x.

Each of the first wiring portion 24 and the second wiring portion 25 is formed on the support member 23. The first wiring portion 24 and the second wiring portion 25 are separated from each other. The first wiring portion 24 and the second wiring portion 25 contain, for example, copper or a copper alloy.

The first wiring portion 24 is continuously formed from above a part of the third main surface 23a to above a part of the recessed portion 231. Each first terminal portion 213 is bonded to the first wiring portion 24 through the conductive bonding material 219a. Therefore, the first wiring portion 24 is electrically connected to each first coil 210 (wiring layer 212). As illustrated in FIGS. 8 and 9, each pad 201 is formed on the first wiring portion 24.

The second wiring portion 25 is formed on a part of the third main surface 23a. Each second terminal portion 224 is bonded to the second wiring portion 25 through the conductive bonding material 229a. Therefore, the second wiring portion 25 is electrically connected to each second coil 220 (first wiring layer 222A of wiring layer 222). As illustrated in FIGS. 8 and 9, each pad 202 is formed on the second wiring portion 25.

The insulating film 26 is formed between the support member 23 and each first wiring portion 24 and between the support member 23 and each second wiring portion 25. The insulating film 26 covers the third main surface 23a, the bottom surface 231a, and the inclined surface 231b. The insulating film 26 is, for example, an oxide film and contains $SiO_2$. The insulating film 26 suppresses electrical connection of the first wiring portion 24 and the second wiring portion 25 through the support member 23. The thickness of the insulating film 26 is, for example, approximately 10 μm. Although the insulating film 26 may not be provided when the support member 23 contains an insulating material, it is preferable to provide the insulating film 26 in order to suppress unintentional electrical connection through the support member 23. The unintentional electrical connection occurs between, for example, the first wiring portion 24 and the second wiring portion 25 or between the first and second wiring portions 24 and 25 and the first island portion 311.

As illustrated in FIG. 9, each first coil 210 of the first substrate 21 and each second coil 220 of the second substrate 22 are magnetically coupled in the electronic part 2A. The first base 211 is arranged between each first coil 210 and each second coil 220.

In the example illustrated in FIG. 9, there is a gap between the first substrate 21 and the second substrate 22 in the electronic part 2A. The size of the gap along the thickness direction z is approximately several tens of μm. The sealing resin 5 may be provided in the gap, or the gap may be an air gap without the sealing resin 5 (air or vacuum may be provided).

Actions and effects of the electronic part 2A and the semiconductor device A1 are as follows.

The electronic part 2A includes the first substrate 21 and the second substate 22. The first substrate 21 includes the first coil 210 and the first base 211, and the second substrate 22 includes the second coil 220 and the second base 221. The first base 211 is positioned between the first coil 210 and the second coil 220 in the thickness direction z. According to the configuration, the first coil 210 and the second coil 220 are formed on different substrates (first substrate 21 and second substrate 22), and the first base 211 is arranged between the first coil 210 and the second coil 220. There is an insulating element that is different from the electronic part 2A and that includes, for example, a primary coil and a secondary coil layered on one silicon substrate. The primary coil and the secondary coil sandwich one interlayer insulating layer in the insulating element, and the primary coil and the secondary coil are insulated by the interlayer insulating layer (silicon oxide film). It is not easy to increase the distance between the primary coil and the secondary coil in this configuration. On the other hand, the first base 211 exists between the first coil 210 and the second coil 220 in the electronic part 2A, and the distance between the first coil 210 and the second coil 220 is larger than when the coils are insulated by the interlayer insulating layer. Therefore, the distance between the first coil 210 and the second coil 220 can be increased in the electronic part 2A, and the dielectric strength can be improved. Note that, in the insulating element different from the electronic part 2A, the number of the interlayer insulating layers between the primary coil and the secondary coil can be increased to increase the distance between the primary coil and the secondary coil. However, the insulating element may be warped in this case, and this may affect the reliability of the electronic part. In addition, a plurality of the interlayer insulating layers need to be formed between the primary coil and the secondary coil, and this reduces the manufacturing efficiency. Therefore, the electronic part 2A can suppress the influence on the reliability and suppress the reduction in the manufacturing efficiency, while securing the dielectric strength.

In the electronic part 2A, the first base 211 contains glass. According to the configuration, the thickness of the first base 211 can be easily adjusted, and this can suppress the reduction in the thickness of the first base 211. That is, the electronic part 2A can properly secure the thickness of the first base 211 and improve the dielectric strength of the first coil 210 and the second coil 220.

In the electronic part 2A, the support member 23 includes the recessed portion 231 that houses at least a part of the first substrate 21. According to the configuration, the increase in the thickness of the electronic part 2A can be suppressed even if the thickness of the first base 211 is increased (for example, 100 μm or more). This can downsize the electronic part 2A while securing the proper dielectric strength.

The semiconductor device A1 includes the electronic part 2A with improved dielectric strength. Therefore, the dielectric strength between the first circuit including the first semiconductor element 11 and the second circuit including the second semiconductor element 12 is improved in the semiconductor device A1.

In the semiconductor device A1, the electronic part 2A is mounted on the first island portion 311 (first lead 31). The first wiring portion 24 is electrically connected to the first semiconductor element 11, and the second wiring portion 25 is electrically connected to the second semiconductor element 12. In the support member 23 provided with the recessed portion 231, the distance between the bottom surface 231a and the third back surface 23b along the thickness direction z is smaller than the distance between the third main surface 23a and the third back surface 23b along the thickness direction z. As a result, the distance between the first wiring portion 24 formed on the bottom surface 231a and the first island portion 311 along the thickness direction z is smaller than the distance between the second wiring portion 25 formed on the third main surface 23a and the first island portion 311 along the thickness direction z. Therefore, the dielectric breakdown of the support member 23 can be suppressed in the electronic part 2A by setting the same potential for the first wiring portion 24 and the first island portion 311, instead of the second wiring portion 25 and the first island portion 311. That is, the structure of the semiconductor device A1 is preferable for improving the dielectric strength of the semiconductor device A1 when the electronic part 2A is mounted on the first island portion 311.

Figure 10:
FIG. 10 is a plan view illustrating a semiconductor device according to a second embodiment, FIG. 10 depicting the sealing resin represented by an imaginary line.

FIGS. 10 and 11 illustrate a semiconductor device A2 according to a second embodiment. Compared to the semiconductor device A1, the semiconductor device A2 includes an electronic part 2B in place of the electronic part 2A. The other components of the semiconductor device A2 are similar to the components of the semiconductor device A1. FIG. 10 is a plan view illustrating the semiconductor device A2, and FIG. 10 corresponds to FIG. 2. FIG. 11 is a cross-sectional view illustrating a detailed configuration example of the electronic part 2B, and FIG. 11 corresponds to FIG. 9.

As illustrated in FIG. 11, the electronic part 2B is mainly different from the electronic part 2A in that the recessed portion 231 is not formed on the support member 23, and a plurality of columnar portions 271 and 272 are provided between the second substrate 22 and the support member 23. The recessed portion 231 is not formed on the support member 23 in the electronic part 2B, and therefore, the plurality of columnar portions 271 and 272 are used to arrange the second substrate 22 above the first substrate 21 in the thickness direction z.

In the electronic part 2B, the first wiring portion 24 and the second wiring portion 25 are entirely formed on the third main surface 23a through the insulating film 26.

Each of the plurality of columnar portions 271 contains a metal material. Each columnar portion 271 is conductive. Each columnar portion 271 extends in the thickness direction z. An end portion of each columnar portion 271 on one side (upper side) in the thickness direction z is bonded to each second terminal portion 224 through the conductive bonding material 229a, and an end portion on the other side (lower side) in the thickness direction z is bonded to the second wiring portion 25 through the conductive bonding material 229a. Therefore, the second wiring portion 25 and each second terminal portion 224 are electrically connected through each columnar portion 271. The dimension of each columnar portion 271 along the thickness direction z is larger than the dimension of the first substrate 21 along the thickness direction z. As a result, the second substrate 22 can be arranged above the first substrate 21 in the thickness direction z.

Each of the plurality of columnar portions 272 contains a metal material. Each columnar portion 272 extends in the thickness direction z. An end portion of each columnar portion 272 on one side (upper side) in the thickness direction z is bonded to each second pad portion 225 through the insulating bonding material 229b, and an end portion on the other side (lower side) in the thickness direction z is bonded to the first wiring portion 24 or the insulating film 26 through the insulating bonding material 229b. Each columnar portion 272 may contain an insulating material instead of the metal material. The dimension of each columnar portion 272 along the thickness direction z is the same as the dimension of each columnar portion 271 along the thickness direction z. Note that the dimension along the thickness direction z of the columnar portion 272 bonded to the insulating film 26 may be increased by the length corresponding to the thickness of the first wiring portion 24, or the thickness of the insulating bonding material 229b for bonding the columnar portion 272 may be increased.

In the example illustrated in FIG. 11, each of the columnar portions 271 and 272 is bonded on one of the first wiring portion 24 and the second wiring portion 25 through the conductive bonding material 229a or the insulating bonding material 229b. Unlike this configuration, each of the columnar portions 271 and 272 may be integrated with one of the first wiring portion 24 and the second wiring portion 25. Such columnar portions 271 and 272 can be formed by, for example, electroplating.

In the electronic part 2B, it is preferable that the dimension of the first substrate 21 along the thickness direction z be approximately several tens of μm (less than 100 μm). This can suppress the increase in the dimension of the electronic part 2B along the thickness direction z and can downsize the electronic part 2B.

The electronic part 2B can also have effects similar to the effects of the electronic part 2A. Therefore, the distance between the first coil 210 and the second coil 220 can be increased in the electronic part 2B, and the dielectric strength is improved.

The electronic part 2B includes the plurality of columnar portions 271 and 272. Therefore, although the recessed portion 231 is not formed on the support member 23, the second substrate 22 can be arranged above the first substrate 21 in the thickness direction z.

Figure 12:
FIG. 12 is a plan view illustrating a semiconductor device according to a third embodiment, FIG. 12 depicting the sealing resin represented by an imaginary line.

FIGS. 12 and 13 illustrate a semiconductor device A3 according to a third embodiment. Compared to the semiconductor device A1, the semiconductor device A3 includes an electronic part 2C in place of the electronic part 2A. FIG. 12 is a plan view illustrating the semiconductor device A3, and FIG. 12 corresponds to FIG. 2. FIG. 13 is a cross-sectional view illustrating a detailed configuration example of the electronic part 2C, and FIG. 13 corresponds to FIG. 9.

As illustrated in FIG. 13, the electronic part 2C is mainly different from the electronic part 2A in that the first substrate 21 further includes a first protection film 215 and first electrodes 216 and the second substrate 22 further includes a second protection film 226 and second electrodes 227.

The first protection film 215 covers a part of the wiring layer 212 while covering the first main surface 211a. The first terminal portions 213 and the first pad portions 214 of the wiring layer 212 are exposed from the first protection film 215.

The first electrodes 216 penetrate the first protection film 215 in the thickness direction z and come into contact with the first terminal portions 213 or the first pad portions 214. The first electrode 216 that comes into contact with the first terminal portion 213 is electrically connected and bonded to the first wiring portion 24 through the conductive bonding material 219a. The first electrode 216 that comes into contact with the first pad portion 214 is bonded to the first wiring portion 24 or the bottom surface 231a through the insulating bonding material 219b.

The second protection film 226 covers a part of the wiring layer 222 (first wiring layer 222A) while covering the second main surface 221a. The second terminal portions 224 and the second pad portions 225 of the wiring layer 222 are exposed from the second protection film 226.

The second electrodes 227 penetrate the second protection film 226 in the thickness direction z and come into contact with the second terminal portions 224 or the second pad portions 225. The second electrode 227 that comes into contact with the second terminal portion 224 is electrically connected and bonded to the second wiring portion 25 through the conductive bonding material 229a. The second electrode 227 that comes into contact with the second pad portion 225 is bonded to one of the second wiring portion 25 and the third main surface 23a through the insulating bonding material 229b.

The electronic part 2C can also have effects similar to the effects of the electronic parts 2A and 2B. Therefore, the distance between the first coil 210 and the second coil 220 can be increased in the electronic part 2C, and the dielectric strength is improved.

In the electronic part 2C, the first substrate 21 includes the first protection film 215. According to the configuration, the wiring layer 212 is covered by the first protection film 215, and the wiring layer 212 can be protected. Similarly, the second substrate 22 includes the second protection film 226. According to the configuration, the wiring layer 222 (first wiring layer 222A) is covered by the second protection film 226, and the wiring layer 222 (first wiring layer 222A) can be protected.

Figure 14:
FIG. 14 is a plan view illustrating a semiconductor device according to a fourth embodiment, FIG. 14 depicting the sealing resin represented by an imaginary line.
Figure 15:
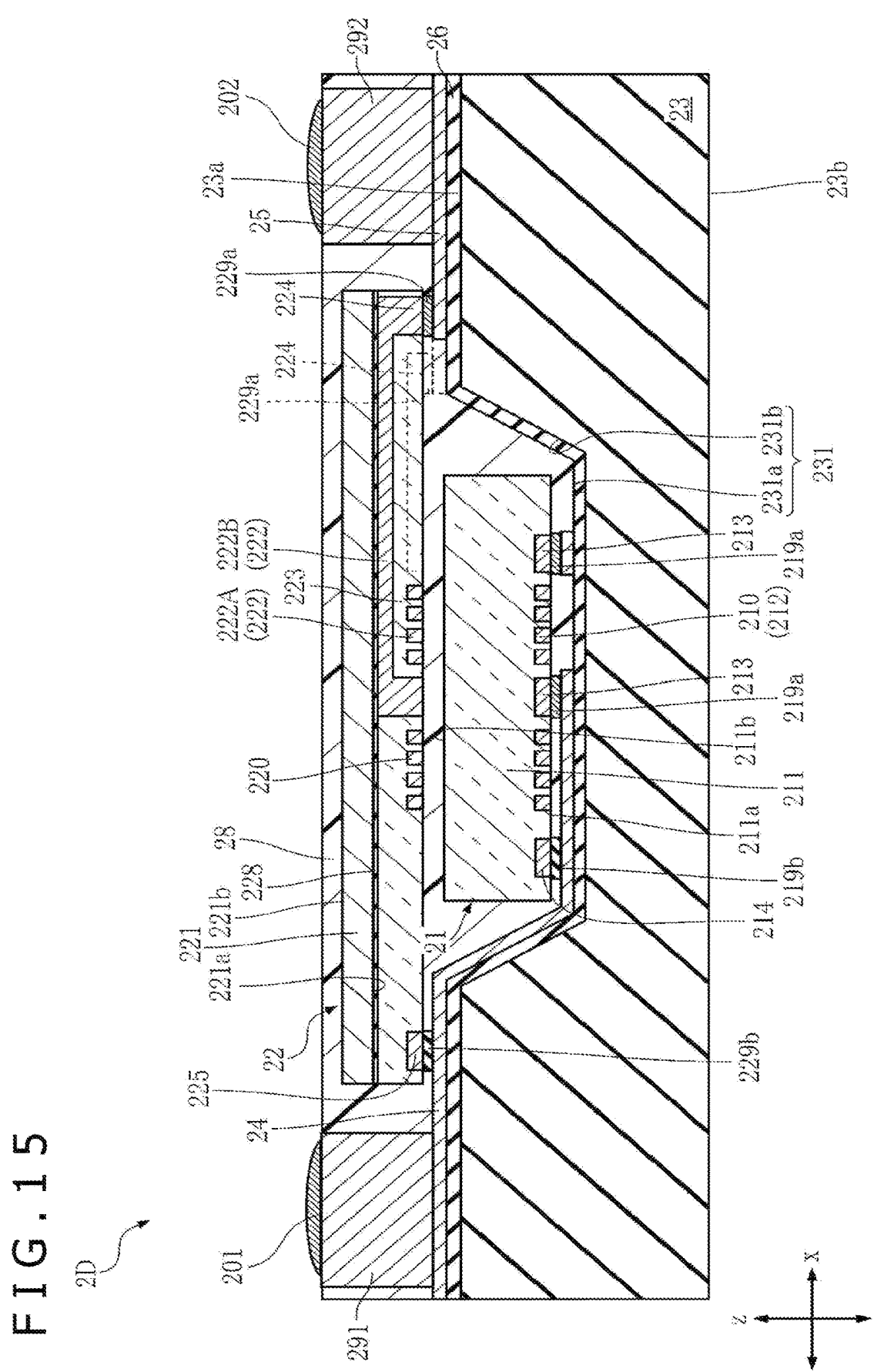
FIG. 15 is a cross-sectional view illustrating a detailed configuration example of an electronic part according to the fourth embodiment.

FIGS. 14 and 15 illustrate a semiconductor device A4 according to a fourth embodiment. Compared to the semiconductor device A1, the semiconductor device A4 includes an electronic part 2D in place of the electronic part 2A. FIG. 14 is a plan view illustrating the semiconductor device A4, and FIG. 14 corresponds to FIG. 2. FIG. 15 is a cross-sectional view of the electronic part 2D, and FIG. 15 corresponds to FIG. 9.

The electronic part 2D is mainly different from the electronic part 2A in that the electronic part 2D includes a resin member 28 that covers at least the first substrate 21 and the second substrate 22. Although the resin member 28 is further provided on the electronic part 2A in the example illustrated in FIG. 15, the resin member 28 may be further provided on the electronic part 2B.

The resin member 28 is formed on the third main surface 23a of the support member 23, and the resin member 28 covers the first substrate 21, the second substrate 22, the first wiring portion 24, and the second wiring portion 25. The resin member 28 contains, for example, an epoxy resin. In the example illustrated in FIG. 15, the resin member 28 is provided between the first substrate 21 and the second substrate 22. Unlike the example illustrated in FIG. 15, there may be an air gap between the first substrate 21 and the second substrate 22. However, the first substrate 21 and the second substrate 22 can be covered by the resin member 28 as illustrated in FIG. 15 when there is a concern on the influence of a temperature cycle (such as expansion of air at the air gap part).

As illustrated in FIG. 15, the electronic part 2D includes a plurality of through electrodes 291 and 292 penetrating the resin member 28 in the thickness direction z.

Each of the plurality of through electrodes 291 electrically connects the first wiring portion 24 and each pad 201. Each through electrode 291 is arranged on the first wiring portion 24. An upper end portion of each through electrode 291 in the thickness direction z is exposed from the resin member 28. Each pad 201 is formed on the part exposed from the resin member 28.

Each of the plurality of through electrodes 292 electrically connects the second wiring portion 25 and each pad 202. Each through electrode 292 is arranged on the second wiring portion 25. An upper end portion of each through electrode 292 in the thickness direction z is exposed from the resin member 28. Each pad 202 is formed on the part exposed from the resin member 28.

The electronic part 2D can also have effects similar to the effects of the electronic parts 2A to 2C. Therefore, the distance between the first coil 210 and the second coil 220 can be increased in the electronic part 2B, and the dielectric strength is improved.

The electronic part 2D includes the resin member 28. This can further protect the first substrate 21, the second substrate 22, the first wiring portion 24, and the second wiring portion 25.

In the fourth embodiment, the range of forming the resin member 28 is not limited to the example illustrated in FIG. 15. For example, the resin member 28 may be formed to cover the first substrate 21 and the second substrate 22, and a part of the first wiring portion 24 and the second wiring portion 25 may be exposed as illustrated in FIG. 16.

In the first to fourth embodiments, the upper side and the lower side of the second substrate 22 may be reversed in each of the electronic parts 2A to 2D. For example, FIG. 17 illustrates an example in which the upper side and the lower side of the second substrate 22 are reversed in the electronic part 2B. In the example illustrated in FIG. 17, the second base 221 is arranged such that the second main surface 221a faces upward in the thickness direction z and the second back surface 221b faces downward in the thickness direction z. Each second terminal portion 224 is positioned on the upper side in this case, and therefore, it is difficult to electrically connect each second terminal portion 224 and the second wiring portion 25 through each columnar portion 271. Therefore, each second terminal portion 224 and the second wiring portion 25 are electrically connected through a wire 293 in the example illustrated in FIG. 17. Both the first base 211 and the second base 221 are arranged between the first coil 210 and the second coil 220 in the example illustrated in FIG. 17. Therefore, the distance between the first coil 210 and the second coil 220 can be further increased in the electronic part illustrated in FIG. 17, and the dielectric strength is further improved.

Figure 18:
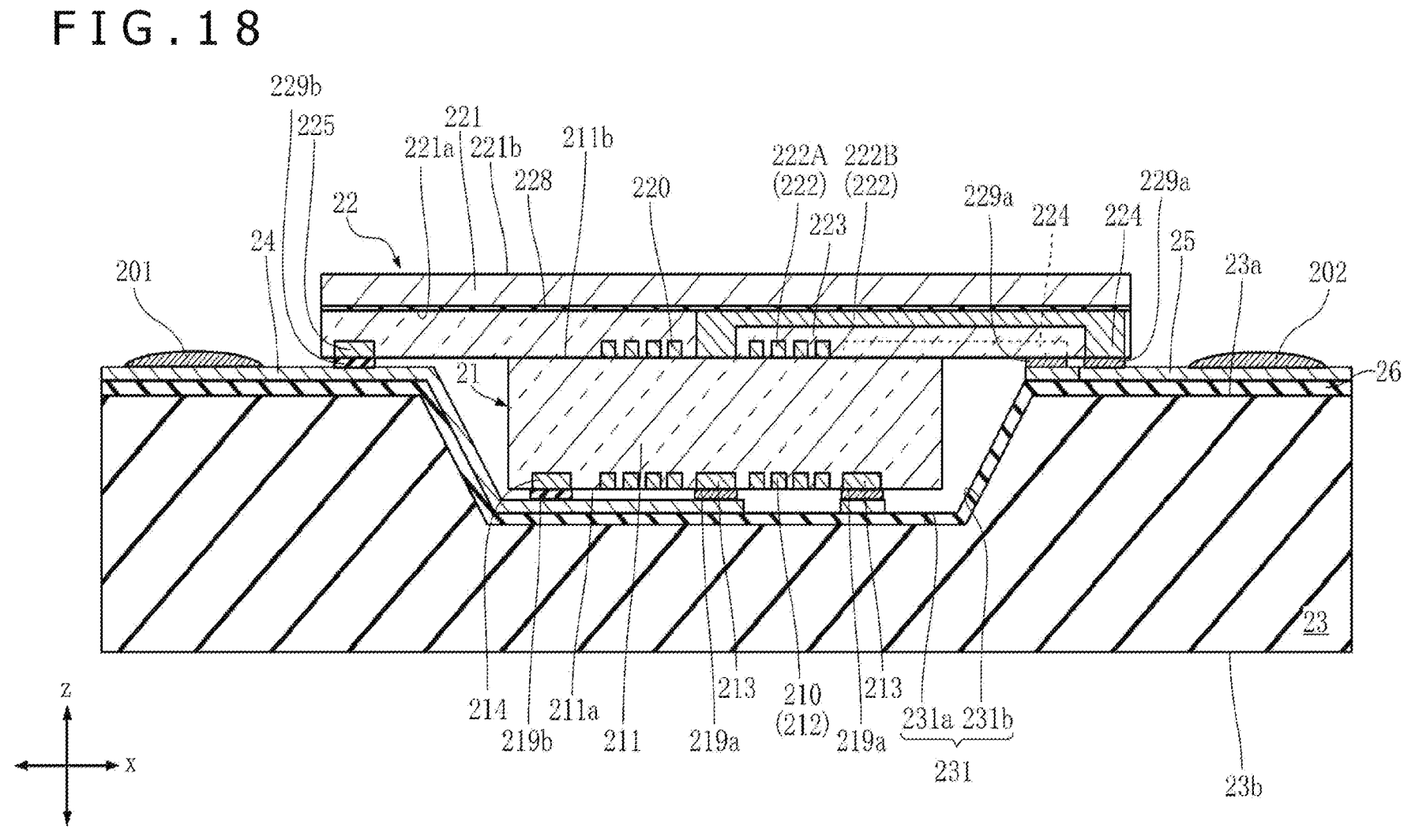

In the first to fourth embodiments, the first substrate 21 and the second substrate 22 may be in contact with each other without a gap between the first substrate 21 and the second substrate 22 in each of the electronic parts 2A to 2D. For example, FIG. 18 illustrates an example in which the first substrate 21 and the second substrate 22 are stacked without a gap in the electronic part 2A. Note that, other than the electronic part 2A, the configuration can also be similar in the other electronic parts 2B to 2D. In the electronic part illustrated in FIG. 18, the surface (first main surface 211a) on the upper side of the first substrate 21 in the thickness direction z and the surface on the lower side of the second substrate 22 in the thickness direction z are in contact with each other. Such a configuration can be provided by, for example, increasing the thickness of the first base 211 of the first substrate 21.

In the first to fourth embodiments, the first base 211 of the first substrate 21 may contain silicon instead of glass in each of the electronic parts 2A to 2D. That is, the first substrate 21 may include a silicon substrate instead of a glass substrate. In this case, the configuration of the first substrate 21 is similar to the configuration of the second substrate 22. However, the dielectric strength of the first coil 210 and the second coil 220 is higher when the first substrate 21 is a glass substrate than when the first substrate 21 is a silicon substrate. In addition, the second base 221 of the second substrate 22 may contain glass instead of silicon in each of the electronic parts 2A to 2D. That is, the second substrate 22 may include the glass substrate instead of the silicon substrate. The second base 221 of the second substrate 22 may contain an insulating semiconductor material such as silicon of intrinsic semiconductor and insulated silicon. The insulating film 228 may not be provided when the second base 221 contains an insulating material such as glass.

Figure 19:
FIG. 19 is a plan view illustrating a semiconductor device according to a fifth embodiment, FIG. 19 depicting the sealing resin represented by an imaginary line.
Figure 20:
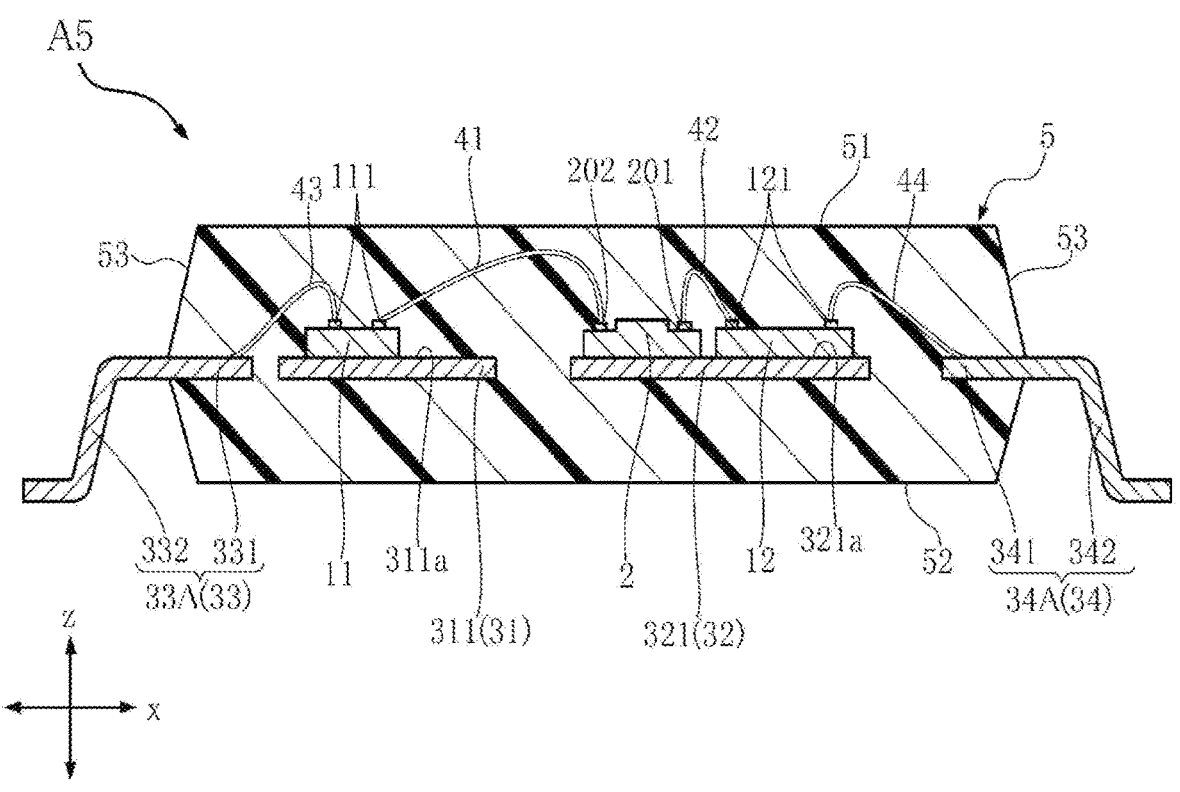
FIG. 20 is a cross-sectional view along a line XX-XX in FIG. 19.

FIGS. 19 and 20 illustrate a semiconductor device A5 according to a fifth embodiment. Although the semiconductor device A5 includes the electronic part 2A similarly to the semiconductor device A1 in the example illustrated in FIGS. 19 and 20, the semiconductor device A5 may include any one of the electronic parts 2B to 2D instead of the electronic part 2A. FIG. 19 is a plan view illustrating the semiconductor device A5, and FIG. 19 corresponds to FIG. 2. FIG. 20 is a cross-sectional view along a line XX-XX in FIG. 19, and FIG. 20 corresponds to FIG. 6.

The semiconductor device A5 is mainly different from the semiconductor device A1 in that the electronic part 2A is mounted on the second lead 32 (second island portion 321) instead of the first lead 31 (first island portion 311) as illustrated in FIGS. 19 and 20.

In the example illustrated in FIGS. 19 and 20, the left side and the right side of the electronic part 2A are reversed, and each pad 201 is positioned closer to the second semiconductor element 12 in the first direction x than each pad 202. As illustrated in FIG. 20, it is preferable to use the second wire 42 to connect each pad 201 and each pad 121 and to use the first wire 41 to connect each pad 202 and each pad 111. In this way, the first coil 210 (first substrate 21) is electrically connected to the second semiconductor element 12, and the second coil 220 (second substrate 22) is electrically connected to the first semiconductor element 11. Therefore, the potential of the first substrate 21 and the potential of the second lead 32 become the same. In this way, the first wiring portion 24 and the second island portion 321 have the same potential in the semiconductor device A5, and this can suppress the dielectric breakdown of the support member 23. That is, the structure of the semiconductor device A2 is preferable for improving the dielectric strength of the semiconductor device A2 when the electronic part 2A is mounted on the second island portion 321.

The semiconductor device A5 also includes the electronic part 2A similarly to the semiconductor device A1. Therefore, the dielectric strength is improved in the semiconductor device A5 as in the semiconductor device A1.

The electronic part and the semiconductor device according to the present disclosure are not limited to the embodiments. The specific configuration of each component in the electronic part and the semiconductor device according to the embodiments of the present disclosure can be freely designed and changed in various ways. For example, the electronic part and the semiconductor device according to the embodiments of the present disclosure include embodiments related to the following supplements.

(Supplement 1)

An electronic part including:

a first substrate including a first base and a first coil, the first coil being electrically insulated from the first base;

a second substrate including a second base and a second coil, the second coil being electrically insulated from the second base; and a support member that supports the first substrate and the second substrate, in which the first substrate is arranged between the second substrate and the support member in a thickness direction of the support member and overlaps the second substrate as viewed in the thickness direction, the first base is positioned between the first coil and the second coil in the thickness direction, and the first coil and the second coil are magnetically coupled.

(Supplement 2)

The electronic part according to supplement 1, in which the first base includes a first main surface and a first back surface separated in the thickness direction, the first main surface faces the support member, the first back surface faces the second substrate, and the first coil is formed on the first main surface.

(Supplement 3)

The electronic part according to supplement 2, in which the first substrate further includes a first protection film and a first electrode, the first protection film is formed on the first main surface and covers the first coil, and the first electrode penetrates the first protection film and is electrically connected to the first coil.

(Supplement 4)

The electronic part according to supplement 2 or 3, in which the first base contains glass as a constituent material.

(Supplement 5)

The electronic part according to any one of supplements 1 to 4, in which the second base includes a second main surface and a second back surface separated in the thickness direction, and the second main surface faces the first substrate.

(Supplement 6)

The electronic part according to supplement 5, in which the second substrate further includes a plurality of wiring layers layered through an interlayer insulating film, and the plurality of wiring layers are formed on the second main surface.

(Supplement 7)

The electronic part according to supplement 6, in which the plurality of wiring layers include a first wiring layer including the second coil, and the first wiring layer is a surface layer of the plurality of wiring layers closer to the first base in the thickness direction.

(Supplement 8)

The electronic part according to supplement 7, in which the second substrate further includes a second protection film and a second electrode, the second protection film is formed on the first wiring layer and covers the second coil, and the second electrode penetrates the second protection film and is electrically connected to the second coil.

(Supplement 9)

The electronic part according to any one of supplements 5 to 8, in which the second base contains silicon as a constituent element, and the second substrate further includes an insulating film existing between the second base and the plurality of wiring layers in the thickness direction.

(Supplement 10)

The electronic part according to any one of supplements 1 to 9, in which the first substrate and the second substrate are separated in the thickness direction.

(Supplement 11)

The electronic part according to any one of supplements 1 to 10, further including:

a first wiring portion and a second wiring portion formed on the support member and separated from each other, in which the first wiring portion is electrically connected to the first coil, and the second wiring portion is electrically connected to the second coil.

(Supplement 12)

The electronic part according to supplement 11, further including:

an insulating film formed between the support member and each of the first wiring portion and the second wiring portion.

(Supplement 13)

The electronic part according to supplement 11 or 12, in which the support member includes a third main surface facing one side in the thickness direction, the second wiring portion is formed on the third main surface, and the second substrate is positioned on the third main surface.

(Supplement 14)

The electronic part according to supplement 13, further including:

a conductive columnar portion bonded to the second wiring portion and extending in the thickness direction, in which the first wiring portion is further formed on the third main surface, the first substrate is bonded to the first wiring portion, the second substrate is bonded to the columnar portion, and a dimension of the columnar portion along the thickness direction is larger than a dimension of the first substrate along the thickness direction.

(Supplement 15)

The electronic part according to supplement 13, in which the support member includes a recessed portion recessed from the third main surface, the first wiring portion is continuously formed from the third main surface to the recessed portion, the first substrate is bonded to a part of the first wiring portion formed in the recessed portion, and the second substrate is bonded to the second wiring portion.

(Supplement 16)

The electronic part according to any one of supplements 11 to 15, in which the support member contains silicon as a constituent material.

(Supplement 17)

A semiconductor device including:

the electronic part according to any one of supplements 1 to 16;

a conductive support member including a first island portion and a second island portion separated in an orthogonal direction orthogonal to the thickness direction;

a first semiconductor element mounted on the first island portion and included in a first circuit;

a second semiconductor element mounted on the second island portion and included in a second circuit; and a sealing resin that covers the electronic part, the first island portion, the second island portion, the first semiconductor element, and the second semiconductor element, in which the first coil is electrically connected to the first semiconductor element, the second coil is electrically connected to the second semiconductor element, and the first circuit and the second circuit are electrically insulated by the electronic part.

(Supplement 18)

The semiconductor device according to supplement 17, in which the electronic part is mounted on the first island portion.

What is claimed is:

1. An electronic part, comprising:

a first substrate including a first base and a first coil, the first coil being electrically insulated from the first base;

a second substrate including a second base and a second coil, the second coil being electrically insulated from the second base;

a support member that supports the first substrate and the second substrate, wherein the first substrate is between the second substrate and the support member in a thickness direction of the support member, the first substrate overlaps the second substrate as viewed in the thickness direction, the support member includes a third main surface facing one side in the thickness direction, the second substrate is on the third main surface, the support member further includes a recessed portion recessed from the third main surface, the first base is between the first coil and the second coil in the thickness direction, and the first coil is magnetically coupled to the second coil;

a first wiring portion on the support member; and a second wiring portion on the third main surface, wherein the first wiring portion is separated from the second wiring portion, the first wiring portion is electrically connected to the first coil, the first wiring portion is continuous from the third main surface to the recessed portion, the first substrate is bonded to a part of the first wiring portion, the part of the first wiring portion is in the recessed portion, the second substrate is bonded to the second wiring portion, and the second wiring portion is electrically connected to the second coil.

2. The electronic part according to claim 1, wherein the first base includes a first main surface and a first back surface, the first back surface is separated from the first main surface in the thickness direction, the first main surface faces the support member, the first back surface faces the second substrate, and the first coil is on the first main surface.

3. The electronic part according to claim 2, wherein the first base contains glass as a constituent material.

4. The electronic part according to claim 1, wherein the second base includes a second main surface and a second back surface, the second back surface is separated from the second main surface in the thickness direction, and the second main surface faces the first substrate.

5. The electronic part according to claim 4, wherein the second substrate further includes a plurality of wiring layers layered through an interlayer insulating film, and the plurality of wiring layers are on the second main surface.

6. The electronic part according to claim 5, wherein the plurality of wiring layers include:

a first wiring layer including the second coil; and a second wiring layer, and the first wiring layer is a surface layer of the plurality of wiring layers closer to the first base in the thickness direction than the second wiring layer.

7. The electronic part according to claim 5, wherein the second base contains silicon as a constituent element, and the second substrate further includes an insulating film existing between the second base and the plurality of wiring layers in the thickness direction.

8. The electronic part according to claim 1, wherein the first substrate is separated from the second substrate in the thickness direction.

9. The electronic part according to claim 1, further comprising an insulating film between the support member and each of the first wiring portion and the second wiring portion.

10. The electronic part according to claim 1, wherein the support member contains silicon as a constituent material.

* * * * *